(12) United States Patent
    Shimoda et al.

(10) Patent No.: US 10,847,657 B2
(45) Date of Patent: Nov. 24, 2020

(54) METHOD FOR MANUFACTURING THIN FILM TRANSISTOR WITH OXIDE SEMICONDUCTOR CHANNEL

(71) Applicant: JAPAN SCIENCE AND TECHNOLOGY AGENCY, Saitama (JP)

(72) Inventors: Tatsuya Shimoda, Nagano (JP); Satoshi Inoue, Nagano (JP); Tue Trong Phan, Tokyo (JP); Takaaki Miyasako, Shiga (JP); Jinwang Li, Yamanashi (JP)

(73) Assignee: JAPAN SCIENCE AND TECHNOLOGY AGENCY, Saitama (JP)

( * ) Notice: Subject to any disclaimer, the term of this patent is extended or adjusted under 35 U.S.C. 154(b) by 0 days.

(21) Appl. No.: 16/550,161

(22) Filed: Aug. 23, 2019

(65) Prior Publication Data

US 2019/0386151 A1    Dec. 19, 2019

Related U.S. Application Data

(62) Division of application No. 15/352,560, filed on Nov. 15, 2016, now abandoned, which is a division of
(Continued)

(30) Foreign Application Priority Data

Mar. 23, 2012   (JP) ................................. 2012-068133

(51) Int. Cl.
    *H01L 29/786*   (2006.01)
    *H01L 29/66*    (2006.01)
    *H01L 29/49*    (2006.01)

(52) U.S. Cl.
    CPC .... *H01L 29/78696* (2013.01); *H01L 29/4908* (2013.01); *H01L 29/66969* (2013.01); *H01L 29/7869* (2013.01); *H01L 29/78693* (2013.01)

(58) Field of Classification Search
    CPC ......... H01L 29/78696; H01L 29/66969; H01L 29/7869; H01L 29/78693
    (Continued)

(56) References Cited

U.S. PATENT DOCUMENTS 5,368,915 A    11/1994   Ueda
6,653,209 B1   11/2003   Yamagata
(Continued)

FOREIGN PATENT DOCUMENTS

CN    101339959 A    1/2009
JP    2001-168308 A  6/2001
(Continued)

OTHER PUBLICATIONS

WIPO, International Search Report for PCT/JP2013/057621, dated Jun. 4, 2013.
(Continued)

*Primary Examiner* — Robert T Huber

(57) ABSTRACT

A thin film transistor 100 according to the invention includes a gate electrode 20, a channel 44, and a gate insulating layer 34 provided between the gate electrode 20 and the channel 44 and made of oxide (possibly containing inevitable impurities; this applies to oxide hereinafter) containing lanthanum and zirconium. The channel 44 is made of channel oxide including first oxide containing indium, zinc, and zirconium (Zr) having an atomic ratio of 0.015 or more and 0.075 or less relative to indium assumed to be 1 in atomic ratio, second oxide containing indium and zirconium (Zr) having an atomic ratio of 0.055 or more and 0.16 or less relative to the indium (In) assumed to be 1 in atomic ratio, or third oxide containing indium and lanthanum having an atomic ratio of 0.055 or more and 0.16 or less relative to the indium (In) assumed to be 1 in atomic ratio.

3 Claims, 20 Drawing Sheets

Related U.S. Application Data application No. 14/386,811, filed as application No. PCT/JP2013/057621 on Mar. 18, 2013, now Pat. No. 9,536,993.

(58) Field of Classification Search
USPC .......................................... 257/43; 438/104
See application file for complete search history.

(56) References Cited

U.S. PATENT DOCUMENTS

| | | |
|---|---|---|
| 2006/0094168 A1 | 5/2006 | Hoffman et al. |
| 2009/0008638 A1 | 1/2009 | Kang et al. |
| 2010/0044703 A1 | 2/2010 | Yabuta et al. |
| 2010/0276688 A1 | 11/2010 | Yano et al. |
| 2010/0295042 A1 | 11/2010 | Yano et al. |
| 2011/0227064 A1 | 9/2011 | Park et al. |
| 2011/0240988 A1 | 10/2011 | Yano et al. |
| 2012/0012835 A1 | 1/2012 | Herman et al. |
| 2012/0146021 A1 | 6/2012 | Yabuta et al. |
| 2012/0175581 A1 | 7/2012 | Hwang |
| 2013/0240871 A1 | 9/2013 | Shimoda et al. |

FOREIGN PATENT DOCUMENTS

| | | | |
|---|---|---|---|
| JP | 2006-121029 | A | 5/2006 |
| JP | 2007-073697 | A | 3/2007 |
| JP | 2008-277326 | A | 11/2008 |
| JP | 2009-016844 | A | 1/2009 |
| JP | 2010-161227 | A | 7/2010 |
| JP | 2011-199291 | A | 10/2011 |
| WO | 2010/024034 | A1 | 3/2010 |
| WO | 2010/079581 | A1 | 7/2010 |
| WO | 2011/138958 | A1 | 11/2011 |

OTHER PUBLICATIONS

US Patent and Trademark Office, Non-Final Office Action for U.S. Appl. No. 14/386,811, dated Feb. 5, 2016.
US Patent and Trademark Office, Final Office Action for U.S. Appl. No. 14/386,811, dated May 23, 2016.
State Intellectual Property Office of the Peoples Republic of China, Office Action for Chinese patent application No. 201380016026.9, dated Aug. 15, 2016.
WIPO, Written Opinion of the International Searching Authority for PCT/JP2013/057621, dated Jun. 4, 2013.
Taiwan Intellectual Property Office, Office Action for Taiwanese patent Application No. 102110167, dated Jan. 5, 2017.
State Intellectual Property Office of the Peoples Republic of China, Office Action for Chinese patent application No. 201380016026.9, dated Mar. 27, 2017.
US Patent and Trademark Office, Non-Final Office Action for U.S. Appl. No. 15/352,560, dated Jun. 23, 2017.
US Patent and Trademark Office, Final Office Action for U.S. Appl. No. 15/352,560, dated Oct. 26, 2017.
US Patent and Trademark Office, Advisory Action for U.S. Appl. No. 15/352,560, dated Jan. 22, 2018.
US Patent and Trademark Office, Non-Final Office Action for U.S. Appl. No. 15/352,560, dated Feb. 13, 2018.
Werner et al., Permitivity Enhancement and Dielectric Relaxation of Doped Flufnium and Zirconium Oxide, Jul. 10, 2009, IEEE, 2009 IEEE Proceedings of 16th IPFA.
US Patent and Trademark Office, Final Office Action for U.S. Appl. No. 15/352,560, dated Jun. 15, 2018.
US Patent and Trademark Office, Non-Final Office Action U.S. Appl. No. 15/352,560, dated Oct. 1, 2018.
US Patent and Trademark Office, Final Office Action for U.S. Appl. No. 15/352,560, dated Feb. 26, 2019.

[Fig 1]
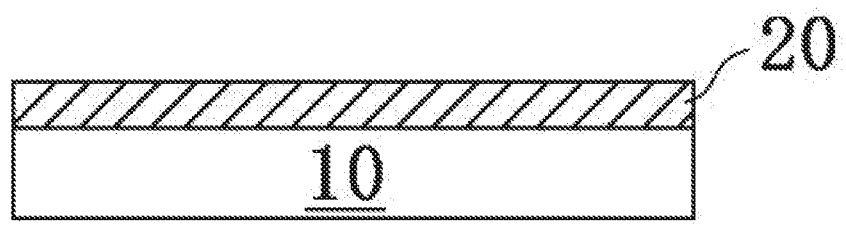
[Fig 2]
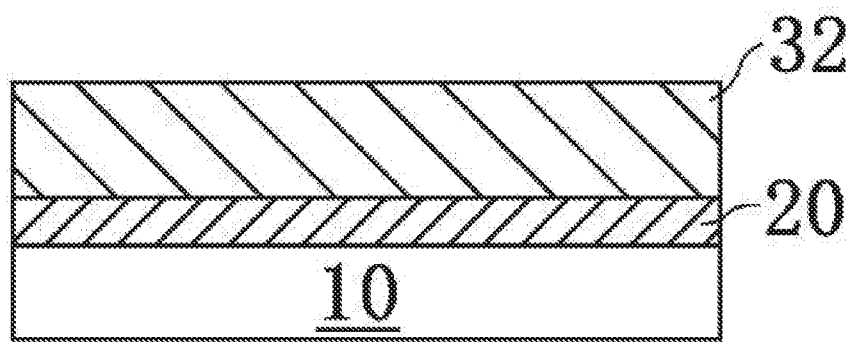

[Fig 3]
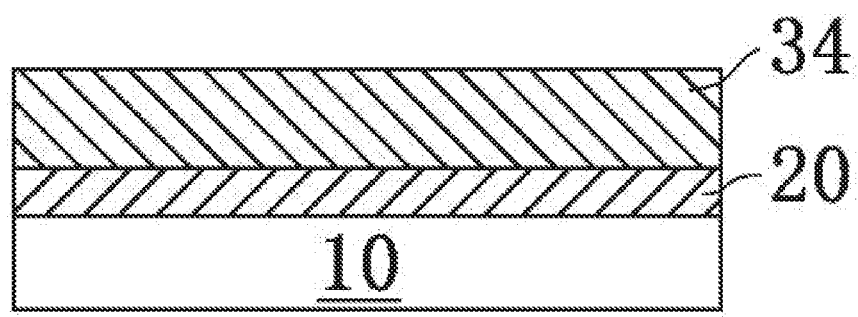
[Fig 4]
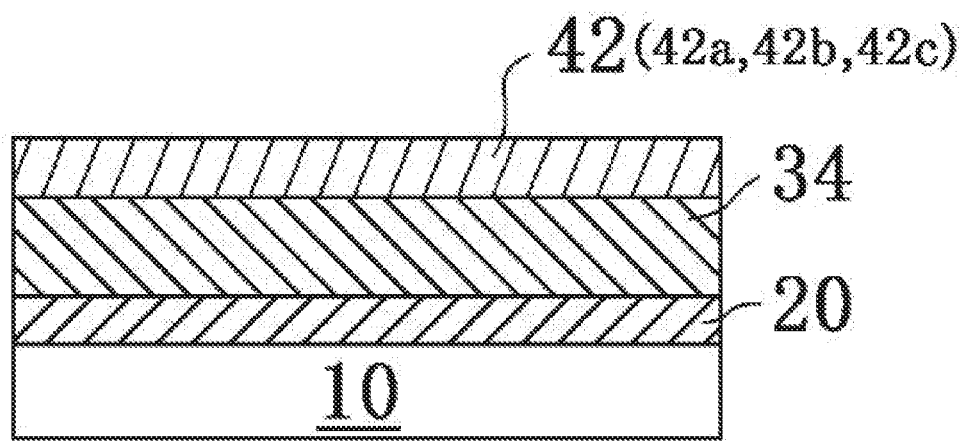

[Fig 5]
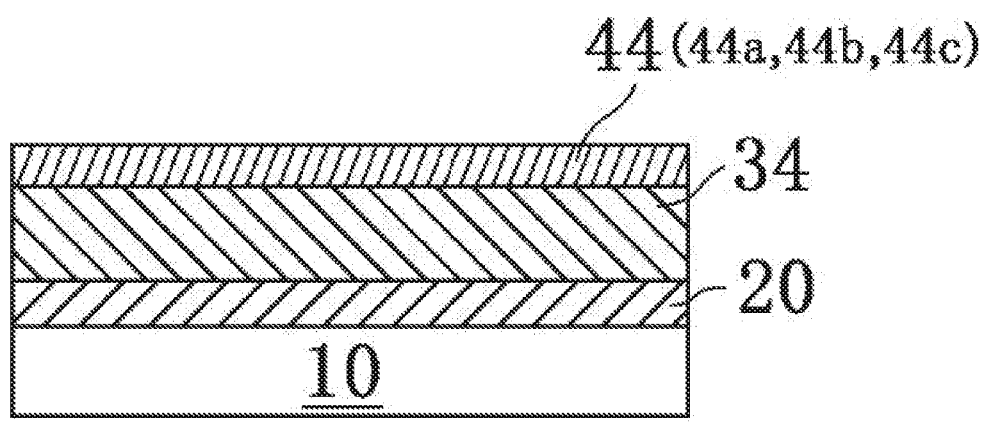
[Fig 6]
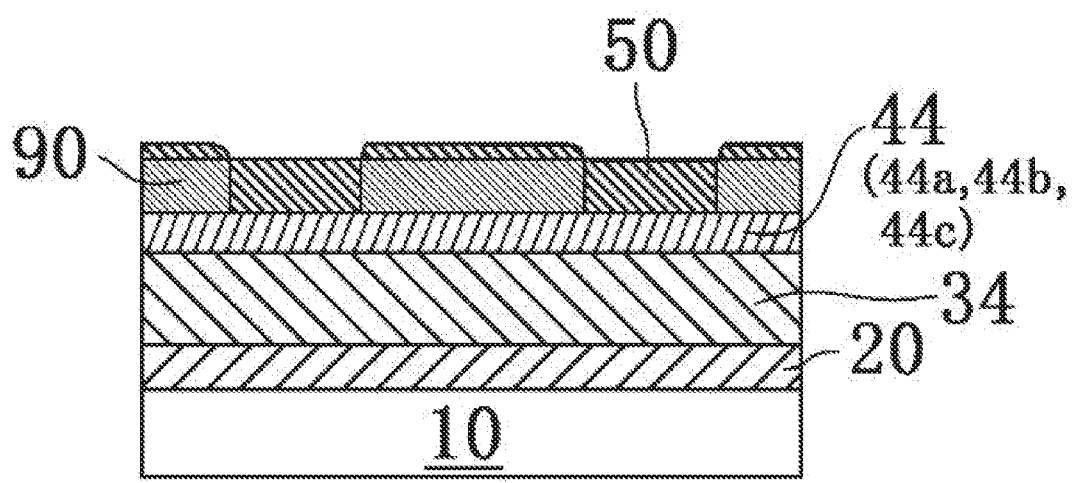

[Fig 7]
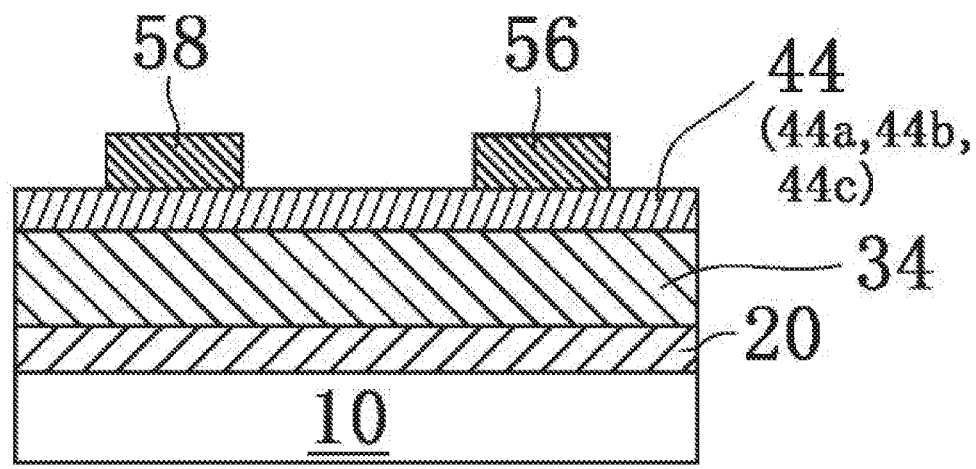
[Fig 8]
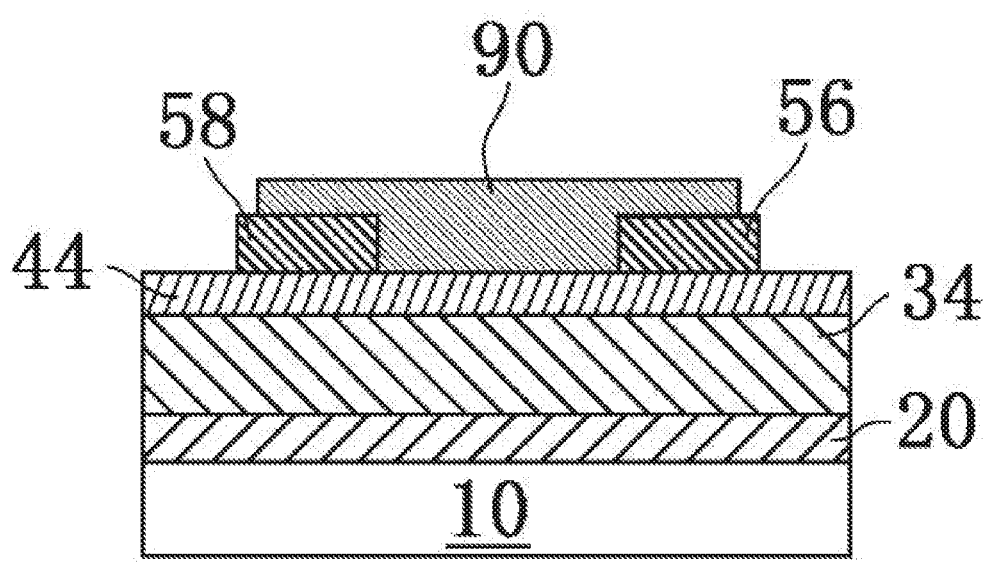

[Fig 9]
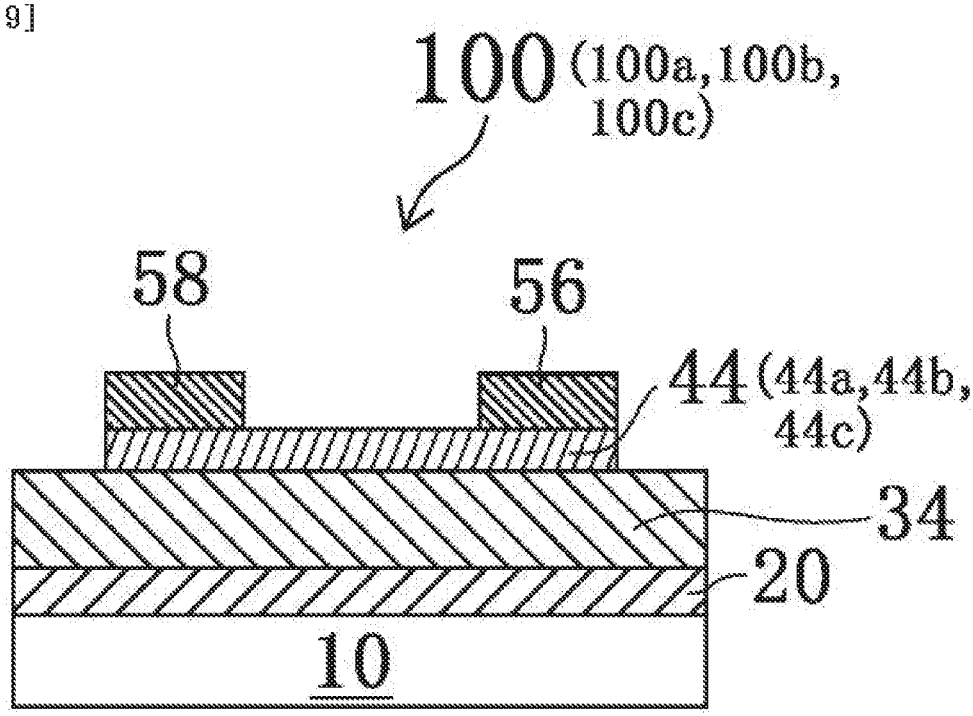
[Fig 10]
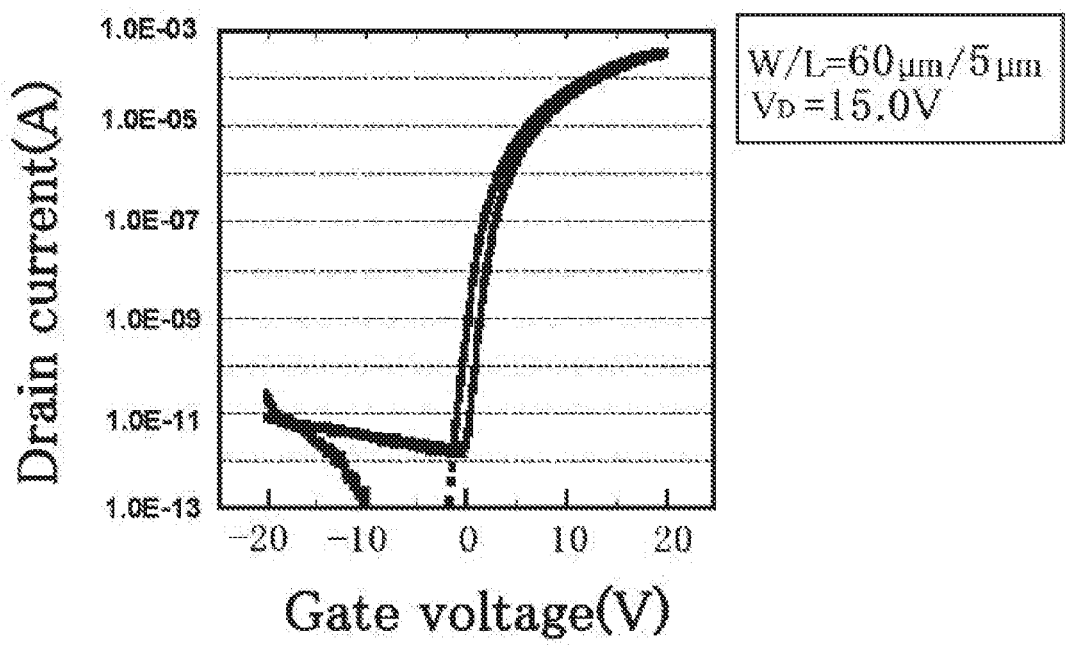

[Fig 11]
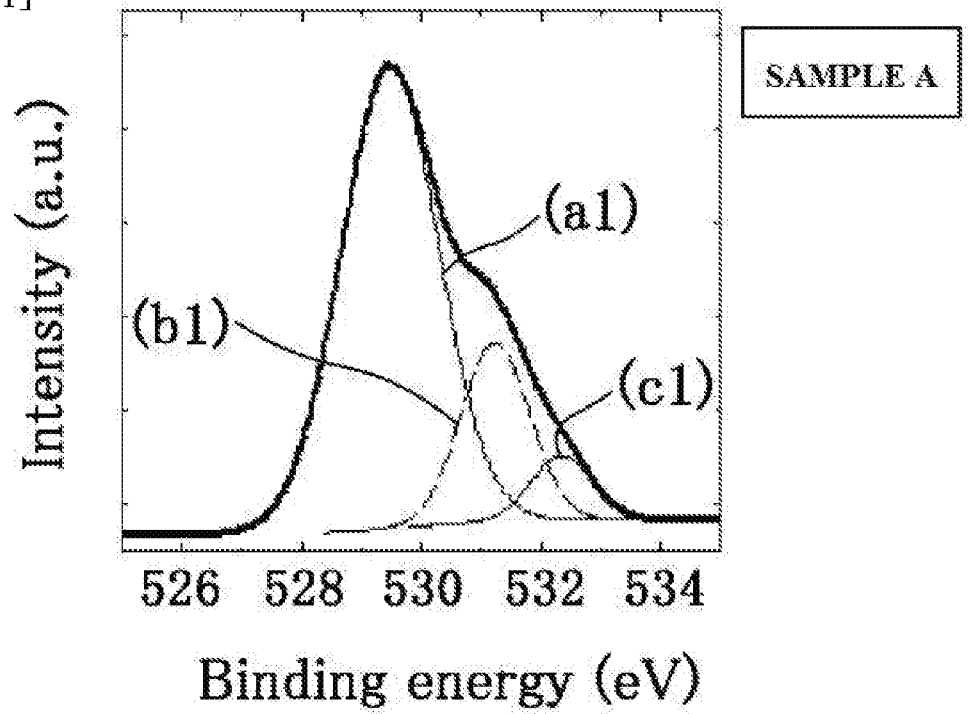
[Fig 12]
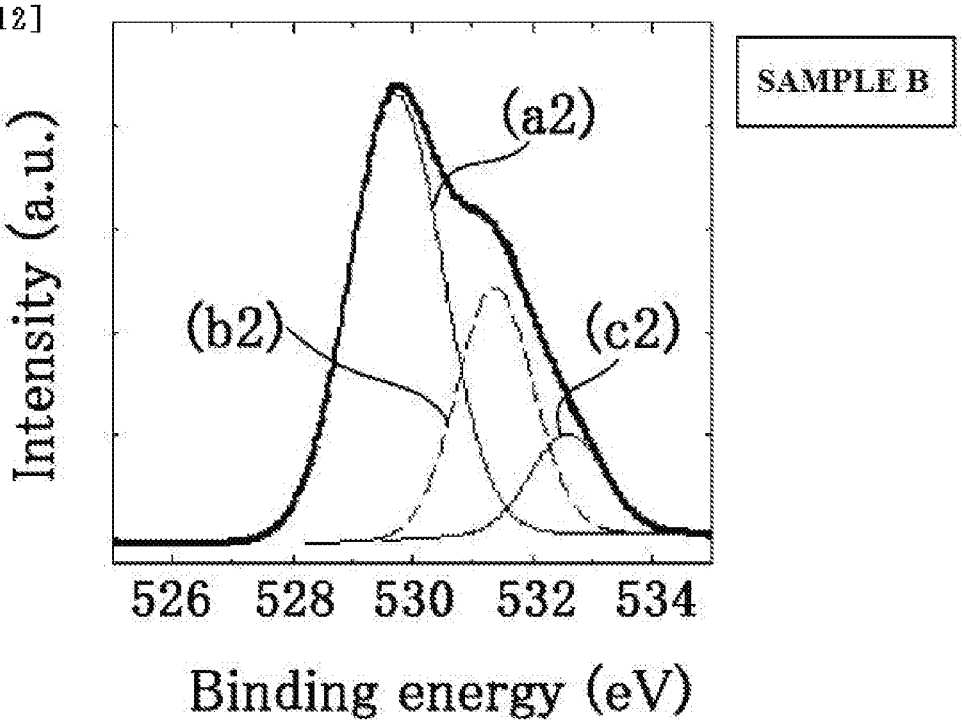

[Fig 13]
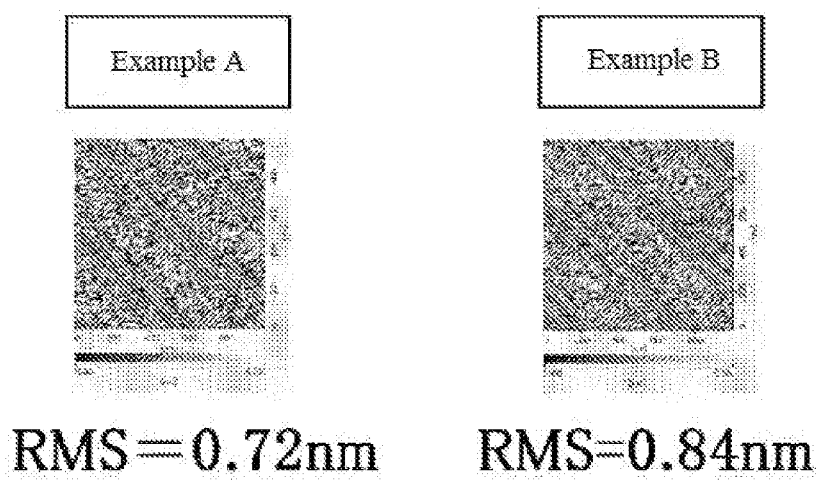
[Fig 14]
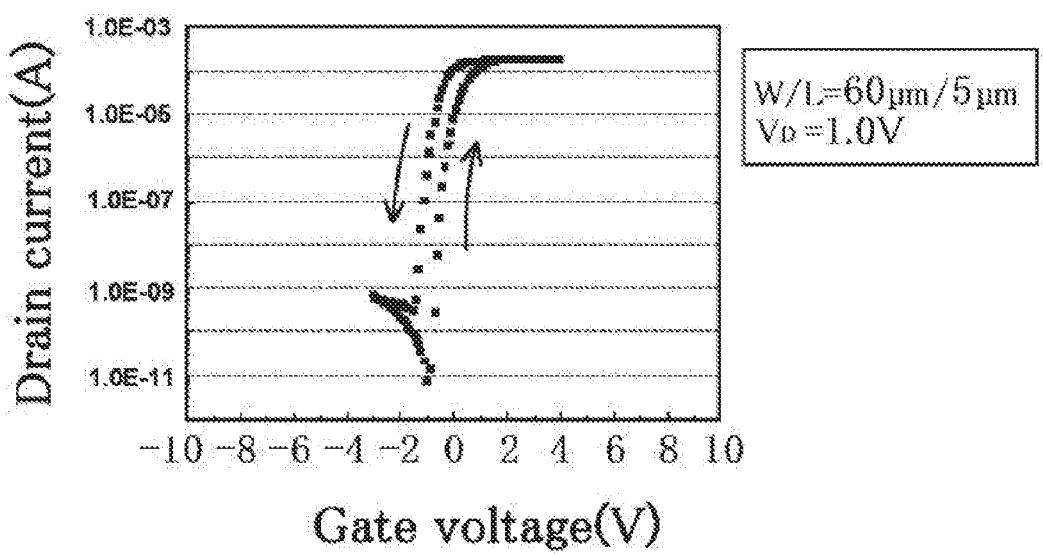

[Fig 15]
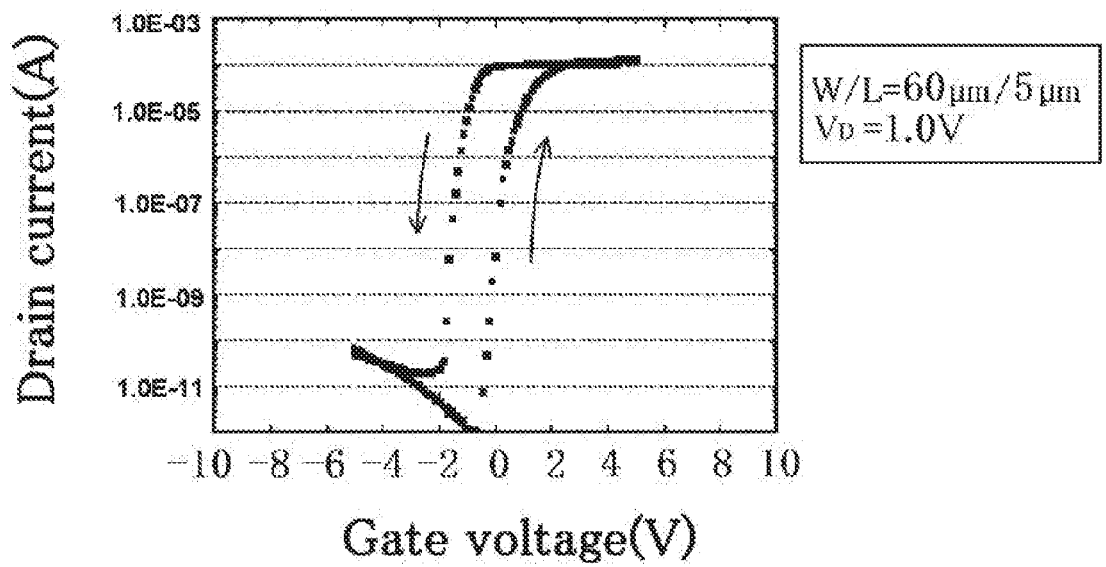
[Fig 16]
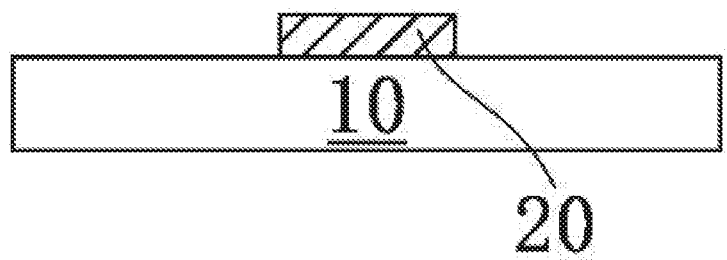

[Fig 17]
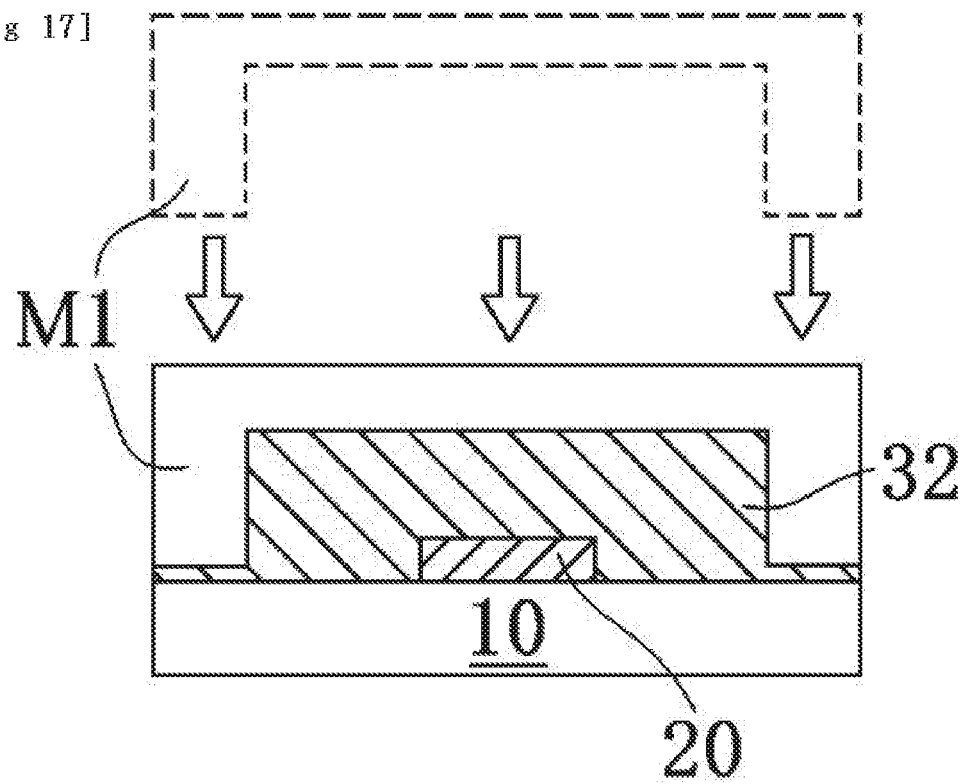
[Fig 18]
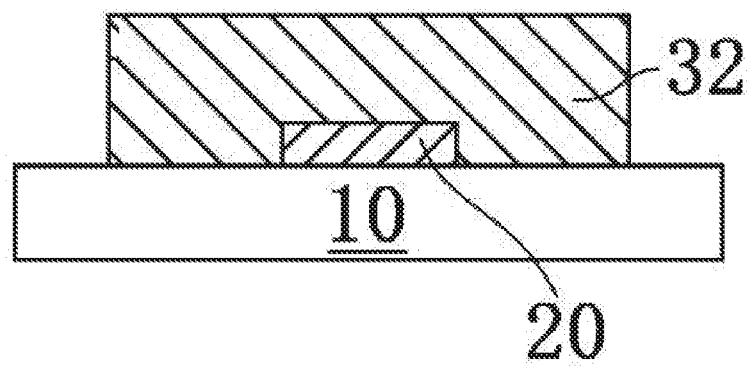

[Fig 19]
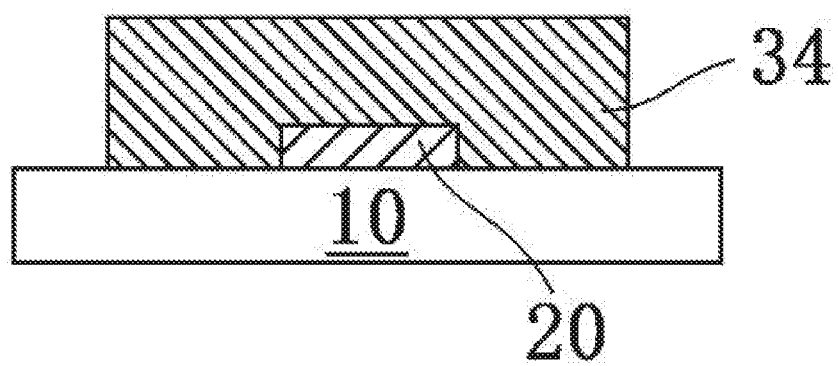
[Fig 20]
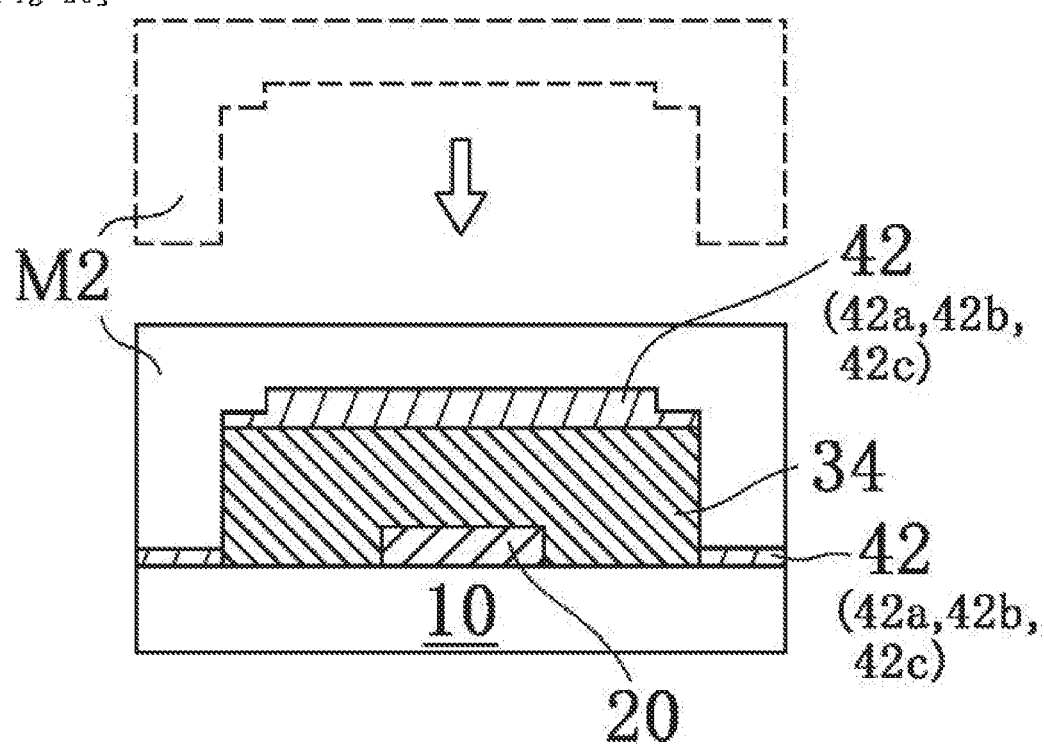

[Fig 21]
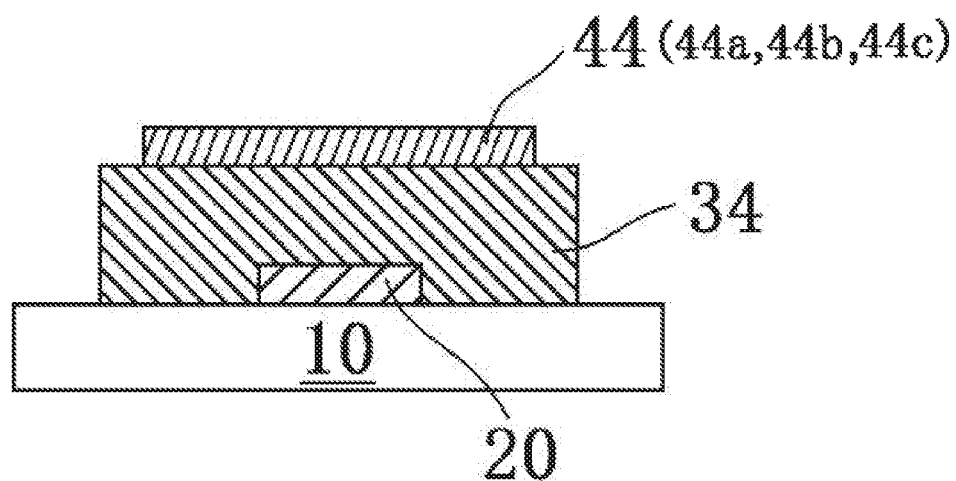
[Fig 22]
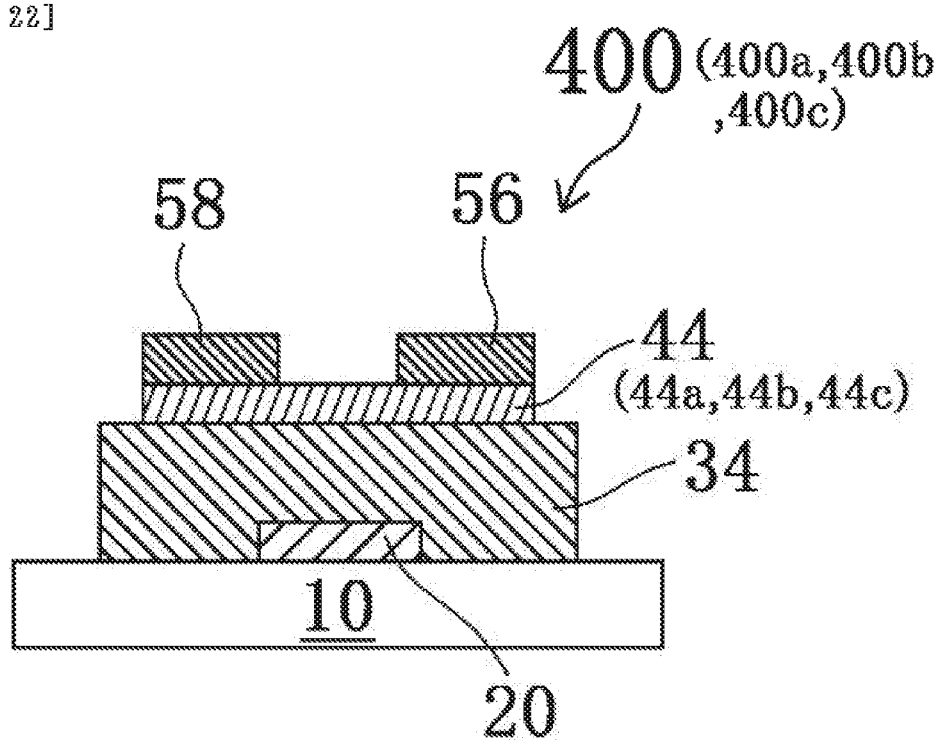

[Fig 23]
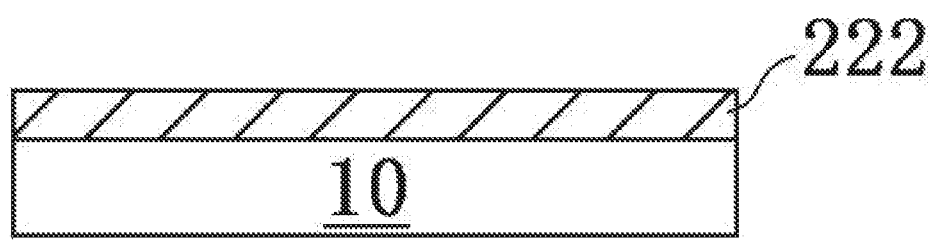
[Fig 24]
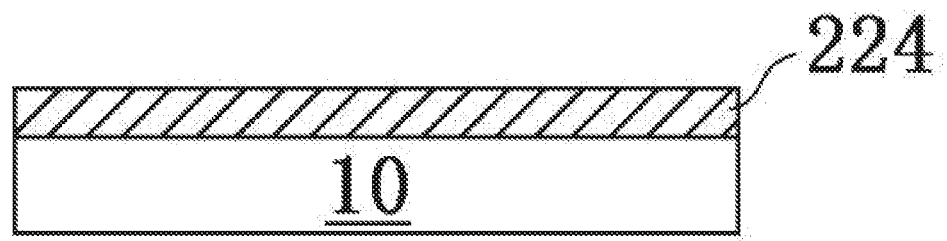

[Fig 25]
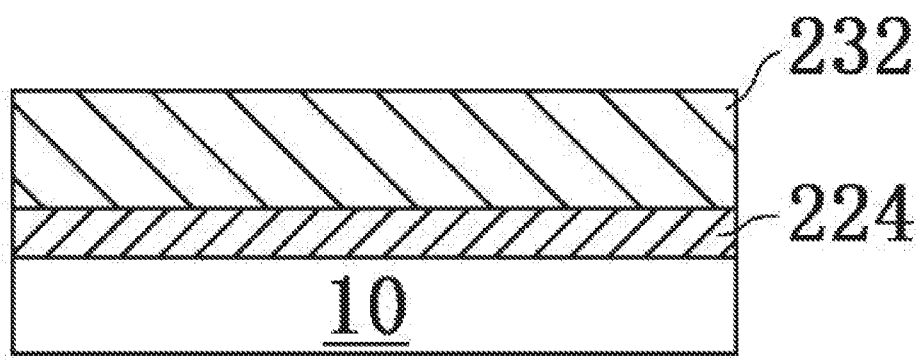
[Fig 26]
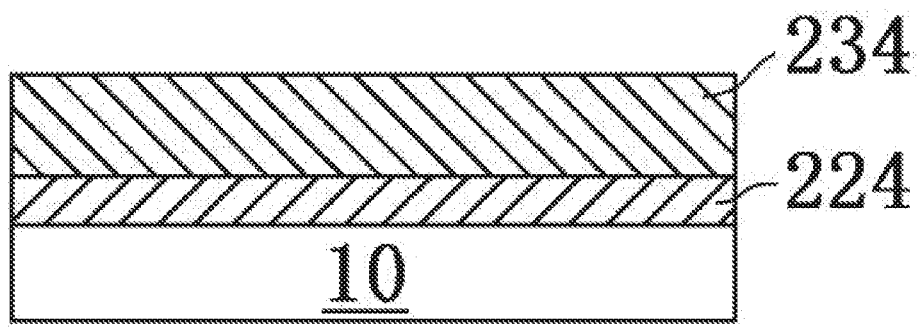

[Fig 27]
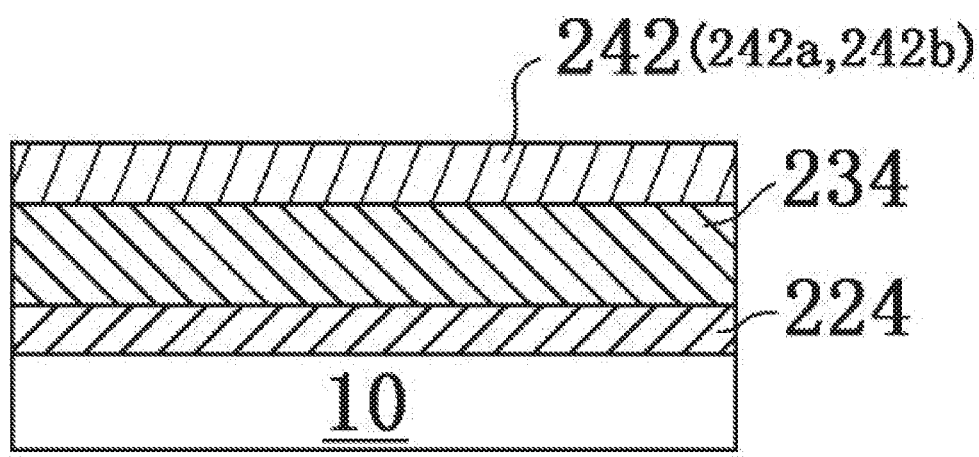
[Fig 28]
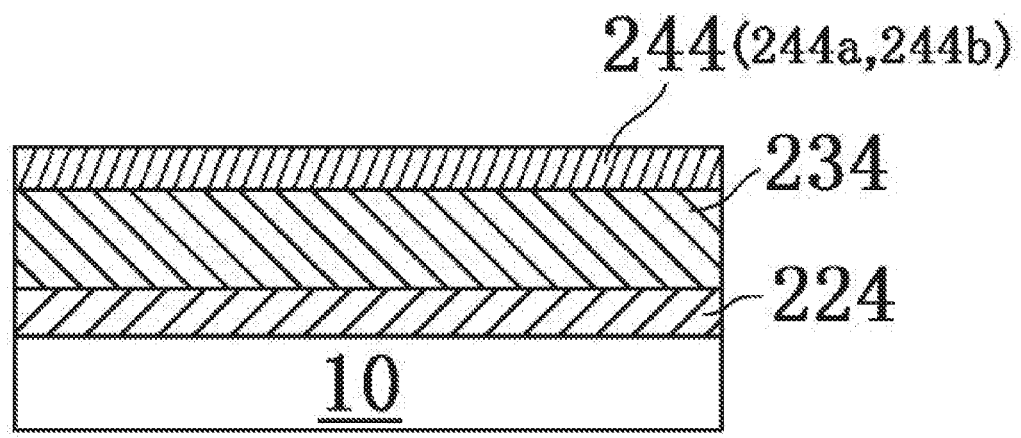

[Fig 29]
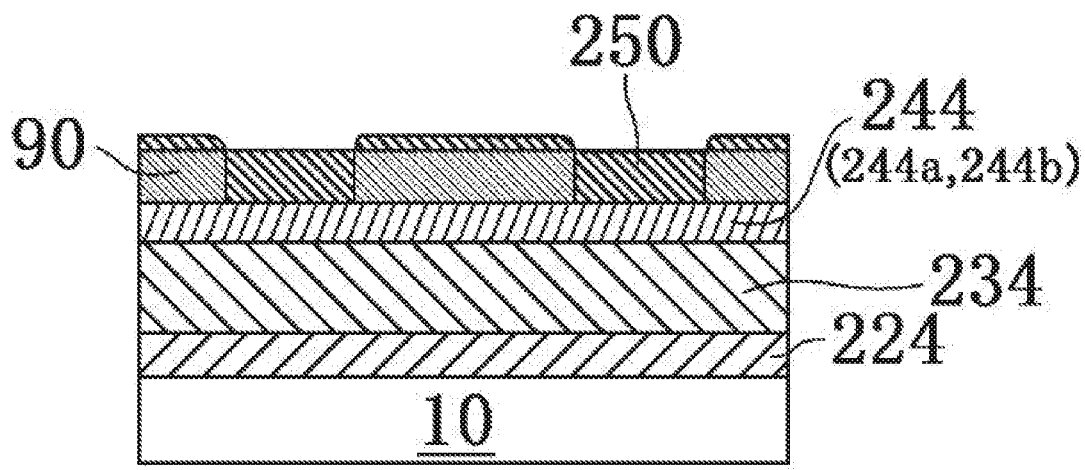
[Fig 30]
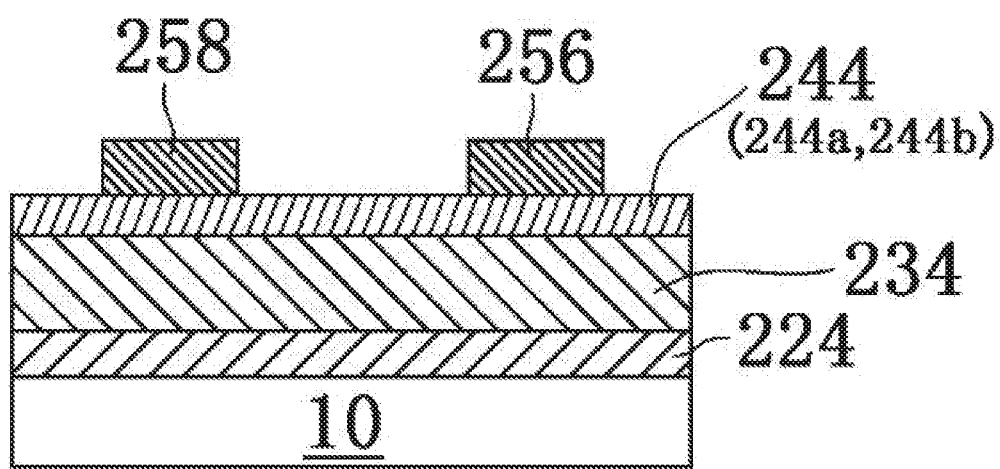

[Fig 31]
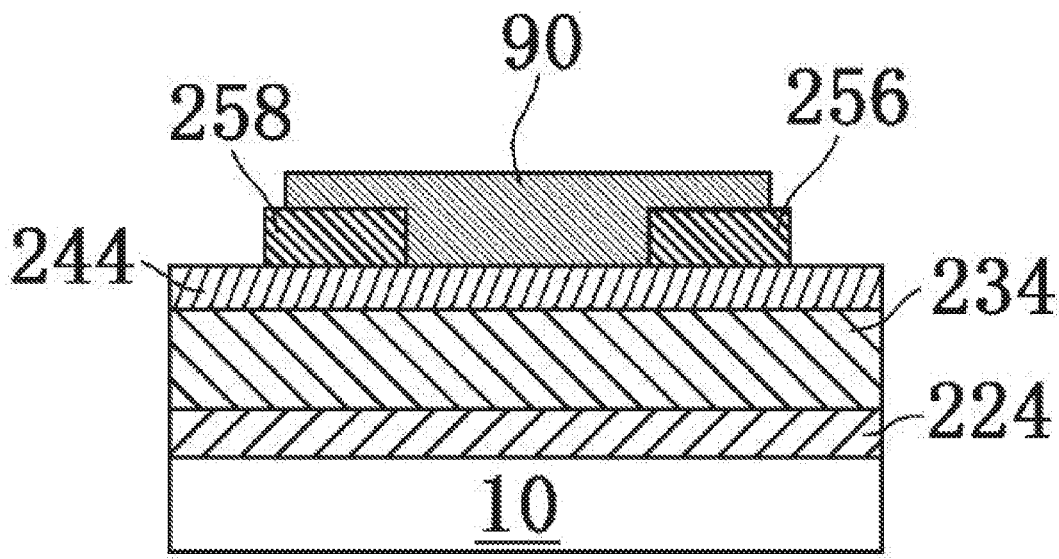
[Fig 32]
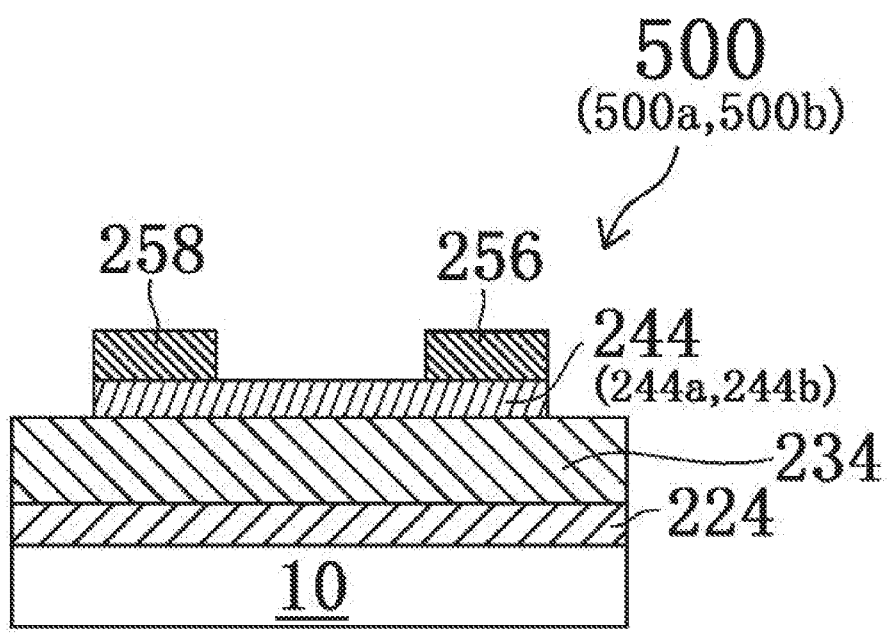

[Fig 33]
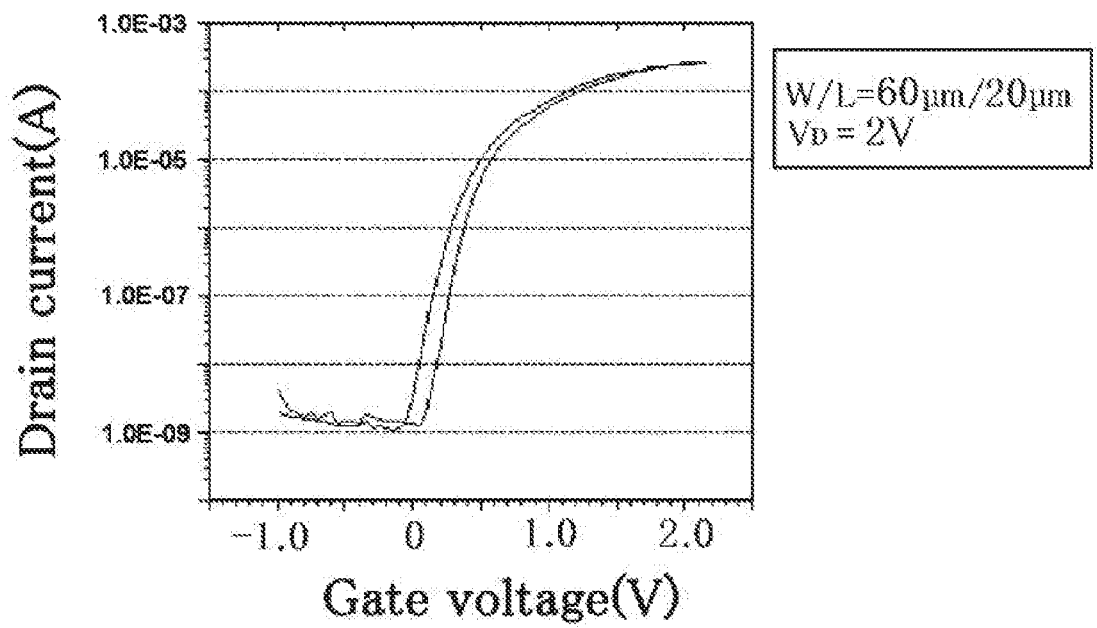
[Fig 34]
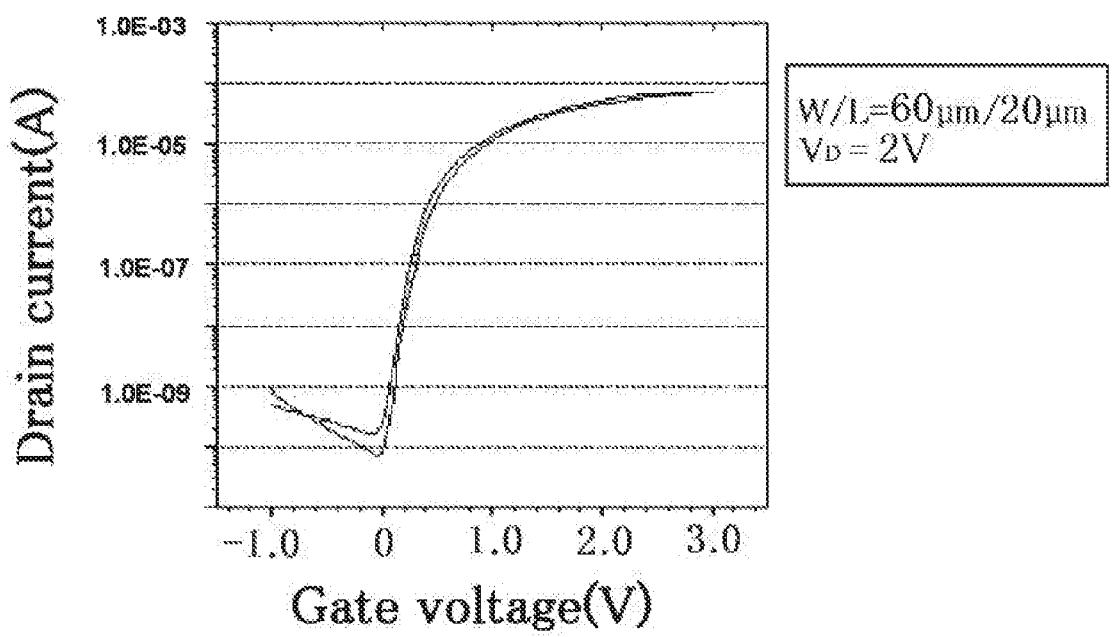

[Fig 35]
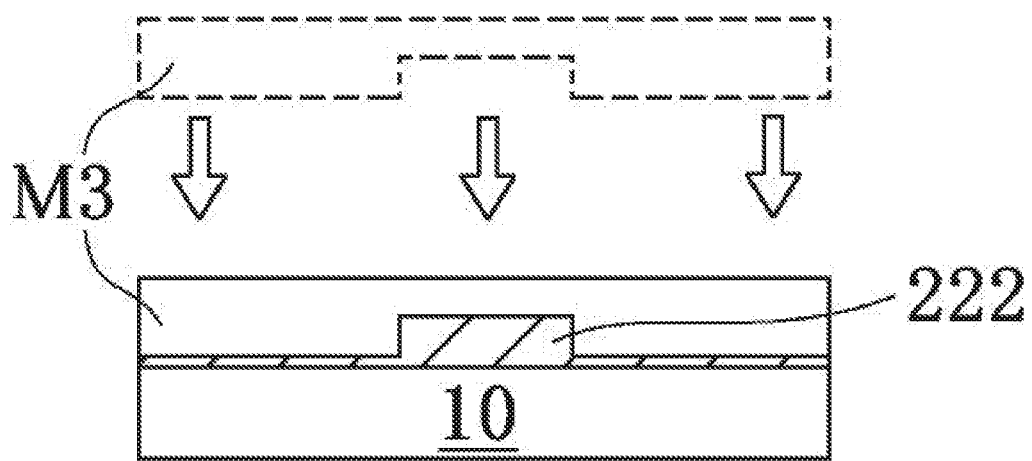
[Fig 36]
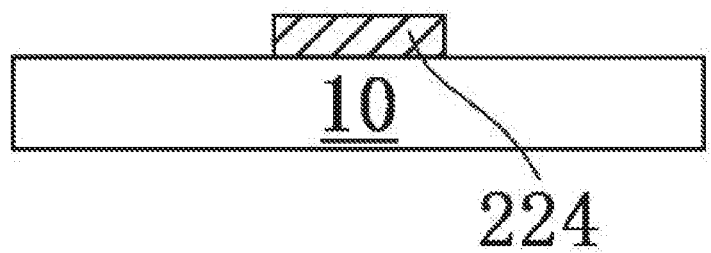

[Fig 37]
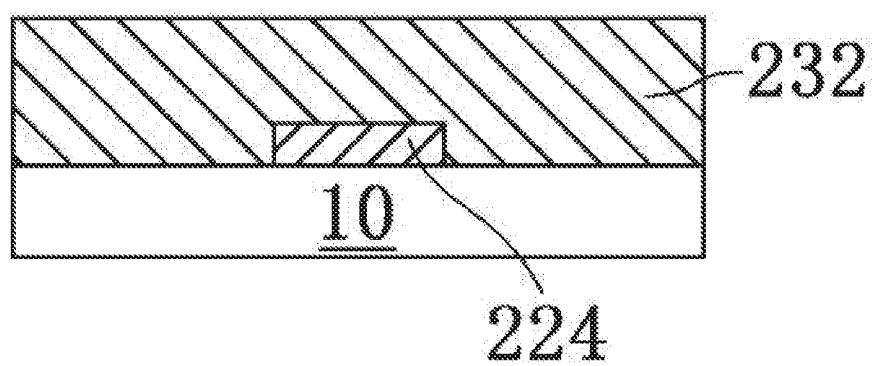
[Fig 38]
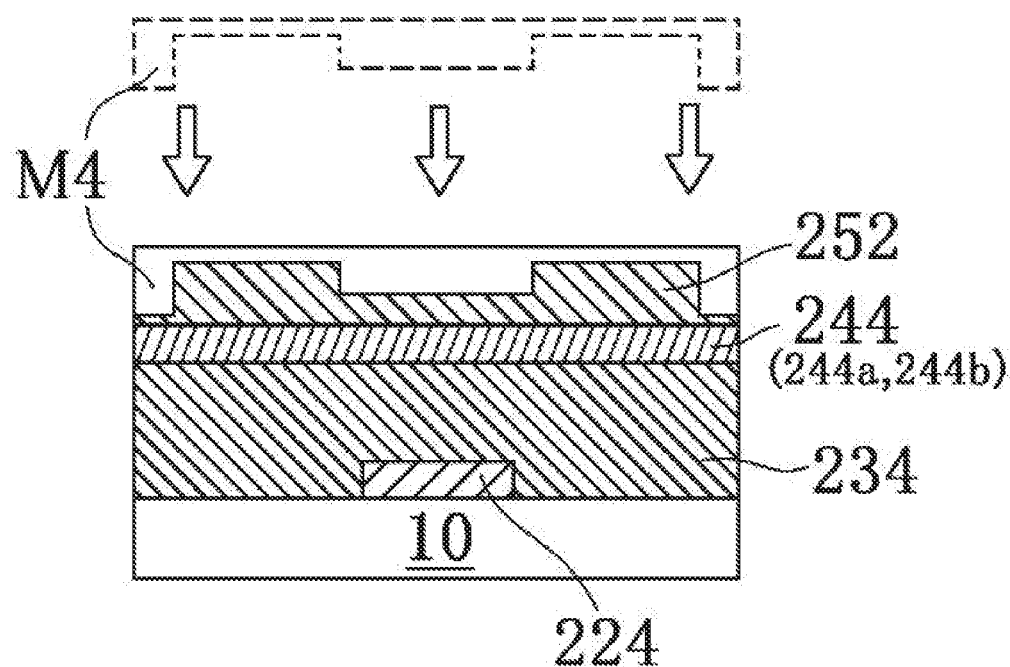

[Fig 39]
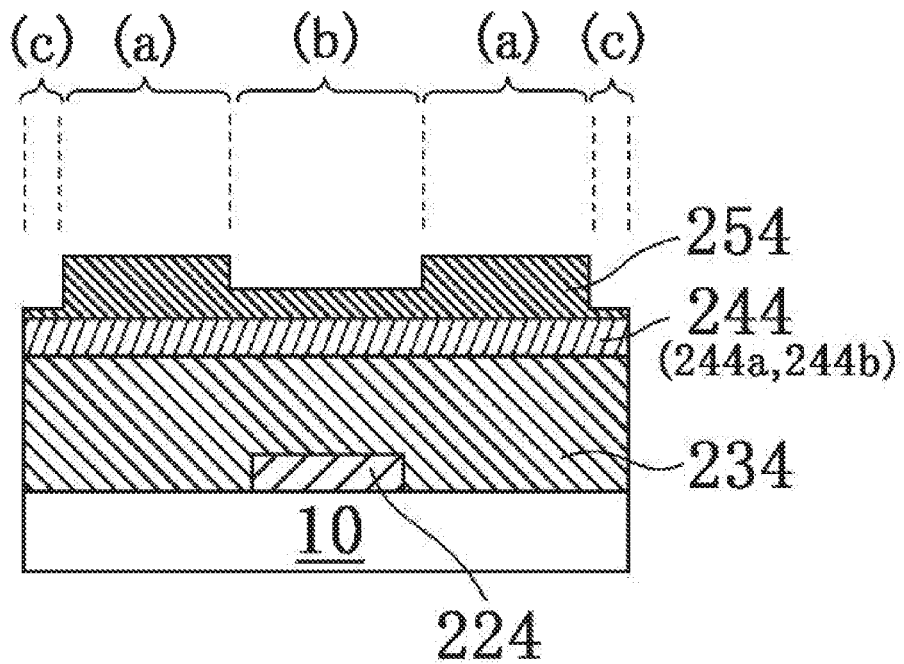
[Fig 40]
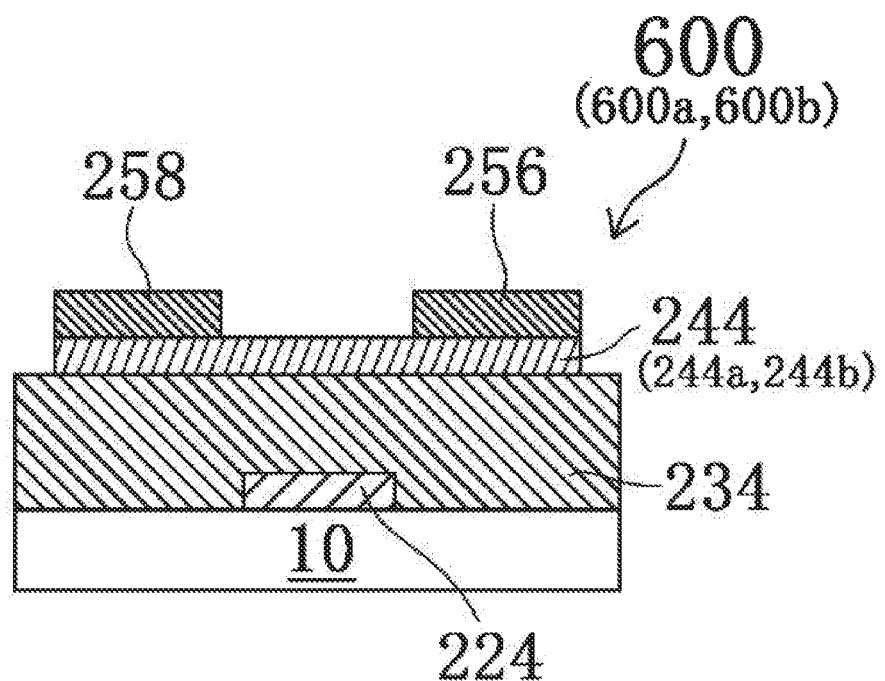

METHOD FOR MANUFACTURING THIN FILM TRANSISTOR WITH OXIDE SEMICONDUCTOR CHANNEL

This application that claims benefit of Japanese Patent Application No. 2012-068133, filed on Mar. 23, 2012. The entire contents of Japanese Patent Application Nos. 2012-068133 are hereby incorporated by reference in its entirety.

TECHNICAL FIELD

The present invention relates to a thin film transistor and a method for manufacturing the thin film transistor.

BACKGROUND ART

Conventionally disclosed is a thin film transistor that includes a gate insulating layer made of a ferroelectric material (e.g. BLT ($Bi_{4-x}La_xTi_3O_{12}$) or PZT ($Pb(Zr_x, Ti_{1-x})O_3$)) in order to enable rapid switching at a low drive voltage. Meanwhile, also disclosed in order to increase carrier density is a thin film transistor that includes a channel made of an oxide conductive material (e.g. indium tin oxide (ITO), zinc oxide (ZnO), or LSCO ($La_xSr_{1-x}CuO_4$)) (Patent Document 1).

In a method for manufacturing the thin film transistor mentioned above, a gate electrode of laminated films made of Ti and Pt is formed in accordance with an electron-beam evaporation technique. The gate insulating layer made of BLT or PZT is formed on the gate electrode in accordance with a sol-gel technique. The channel made of ITO is further formed on the gate insulating layer in accordance with a RF-sputtering technique. Subsequently formed on the channel are Ti and Pt serving as a source electrode and a drain electrode in accordance with an electron-beam evaporation technique. An element region is then isolated from a different element region in accordance with a RIE technique and a wet etching technique (using a mixed solution of HF and HCl) (Patent Document 1). The inventors of this application have studied selection and combination of oxide that appropriately exhibits functions as a thin film transistor (Patent Document 2).

PRIOR ART DOCUMENTS

Patent Documents

Patent Document 1: JP 2006-121029 A
Patent Document 2: WO 2011/138958

SUMMARY OF THE INVENTION

Problems to be Solved by the Invention

There have been exemplified several conventional thin film transistors each including a gate insulating layer or a channel made of complex oxide. However, further development is still required for selection of a material achieving high properties as a thin film transistor and an appropriate manufacturing method therefor. Technical objects to be achieved for better performance of a thin film transistor include improvement in performance of a gate insulating layer and/or a channel as well as improvement in entire performance of the gate insulating layer and the channel laminated together.

Furthermore, a conventional technique typically includes a process that takes relatively long time and/or requires expensive equipment, such as a vacuum process or a process in accordance with a photolithography technique. These processes lead to quite low utilization ratios of raw materials and manufacture energy. When adopting the manufacturing method described above, manufacture of a thin film transistor requires many processing steps and takes long time, which is not preferred in industrial and mass productivity performance. Such a conventional technique also causes the problem that increase in area is relatively difficult to achieve.

The present invention solves at least one of the problems mentioned above, to achieve improvement in performance of a thin film transistor including oxide at least in a channel and a gate insulating layer, or simplification and energy saving in the processes of manufacturing such a thin film transistor. The present invention thus significantly contributes to provision of a thin film transistor that is excellent in industrial and mass productivity performance.

Solutions to the Problems

The inventors of this application repeated intensive researches and analyses on selection and combination of oxide that appropriately exerts functions as a gate electrode, a gate insulating layer, and/or a channel, from a large number of existing oxide materials. The inventors found the following two interesting points.

One of the points is that suppression of excessive oxygen deficiency in a channel significantly contributes to improvement of various properties of a thin film transistor. Specifically, when oxide selected for a channel contains indium (In) and zinc (Zn) or contains indium (In), such oxide is likely to cause an oxygen deficiency state where the functions as the channel are unlikely to be exerted. The inventors of this application found, through repeated trials and errors, that introduction of a certain novel element suppresses oxygen deficiency as well as can contribute to causing an appropriate oxygen deficiency state. Further analyses and studies enabled finding that the novel element can also contribute to promoting amorphization as compared with a case with no addition of this element.

The other one of the points is that selection of a channel material enables processing at a relatively low temperature in a process of manufacturing a thin film transistor.

Both of the points were found through many trials and errors and detailed analyses by the inventors of this application. A high-performance thin film transistor can now be provided by combination of a gate insulating layer made of a specific oxide layer and a channel material achieving formation of a preferred interface with the gate insulating layer. The inventors of this application also found that these oxide materials can be each manufactured through a process achieving significant simplification or energy saving as well as facilitating increase in area as compared with a conventional technique. The present invention was devised in view of the points mentioned above.

A thin film transistor according to the present invention includes a gate electrode, a channel, and a gate insulating layer provided between the gate electrode and the channel and made of oxide (possibly including inevitable impurities) containing lanthanum (La) and zirconium (Zr). This thin film transistor includes the channel made of following channel oxide (1), channel oxide (2), or channel oxide (3). (1) first oxide (possibly including inevitable impurities) containing indium (In), zinc (Zn), and zirconium (Zr) having an atomic ratio of 0.015 or more and 0.075 or less relative to the indium (In) assumed to be 1 in atomic ratio (2) second oxide (possibly including inevitable impurities) containing indium (In) and zirconium (Zr) having an atomic ratio of 0.055 or more and 0.16 or less relative to the indium (In) assumed to be 1 in atomic ratio.

(3) third oxide (possibly including inevitable impurities) containing indium (In) and lanthanum (La) having an atomic ratio of 0.055 or more and 0.16 or less relative to the indium (In) assumed to be 1 in atomic ratio This thin film transistor can suppress excessive oxygen deficiency that is difficult to be suppressed by oxide containing indium (In) and zinc (Zn) or oxide containing indium (In), and can thus significantly improve various properties (e.g. reduction in hysteresis, an ON/OFF ratio, or a sub-threshold characteristic (SS)) as a thin film transistor. This thin film transistor containing a predetermined amount of zirconium (Zr) or a predetermined amount of lanthanum (La) enables relatively facilitated formation of an amorphous phase, which is difficult with oxide containing indium (In), and can thus improve flatness of an oxide layer. The formed amorphous phase is stable with a high crystallization temperature, so that a preferred interface with the gate insulating layer can be formed. The amorphous phase can be formed relatively easily, so that the layered oxide can have improved formability (e.g. easier imprinting and/or improved accuracy after formation by imprinting).

A method for manufacturing a thin film transistor according to the present invention includes a gate insulating layer forming step of forming a gate insulating layer made of oxide (possibly including inevitable impurities) containing lanthanum (La) and zirconium (Zr) by heating, in an atmosphere containing oxygen, a gate insulating layer precursor layer obtained from a gate insulating layer precursor solution as a start material including a precursor containing lanthanum (La) and a precursor containing zirconium (Zr) as solutes, the gate insulating layer being in contact with a gate electrode layer, the gate insulating layer forming step being performed between a step of forming the gate electrode layer and a step of forming a channel by forming channel oxide (possibly including inevitable impurities). In this method for manufacturing the thin film transistor, the step of forming the channel includes a step of heating, in an atmosphere containing oxygen, a channel precursor layer obtained from each of following precursor solutions (1) to (3) as a start material.

(1) a first precursor solution including, as solutes, a precursor containing indium (In), a precursor containing zinc (Zn), and a precursor containing zirconium (Zr) having an atomic ratio of 0.015 or more and 0.075 or less relative to the indium (In) assumed to be 1 in atomic ratio.

(2) a second precursor solution including, as solutes, a precursor containing indium (In) and a precursor containing zirconium (Zr) having an atomic ratio of 0.055 or more and 0.16 or less relative to the indium (In) assumed to be 1 in atomic ratio (3) a third precursor solution including, as solutes, a precursor containing indium (In) and a precursor containing lanthanum (La) having an atomic ratio of 0.055 or more and 0.16 or less relative to the indium (In) assumed to be 1 in atomic ratio In this method for manufacturing the thin film transistor, the step of forming the channel includes the step of forming following channel oxide (4), (5), or (6) by heating, in an atmosphere containing oxygen, the channel precursor layer.

(4) first oxide (possibly including inevitable impurities) containing indium (In), zinc (Zn), and zirconium (Zr) having an atomic ratio of 0.015 or more and 0.075 or less relative to the indium (In) assumed to be 1 in atomic ratio.

(5) second oxide (possibly including inevitable impurities) containing indium (In) and zirconium (Zr) having an atomic ratio of 0.055 or more and 0.16 or less relative to the indium (In) assumed to be 1 in atomic ratio.

(6) third oxide (possibly including inevitable impurities) containing indium (In) and lanthanum (La) having an atomic ratio of 0.055 or more and 0.16 or less relative to the indium (In) assumed to be 1 in atomic ratio.

This method for manufacturing the thin film transistor can suppress excessive oxygen deficiency that is difficult to be suppressed by oxide containing indium (In) and zinc (Zn) or oxide containing indium (In), and thus enables manufacture of a thin film transistor having various excellent properties (e.g. reduction in hysteresis, an ON/OFF ratio, or a sub-threshold characteristic (SS)) as a thin film transistor. In this method for manufacturing the thin film transistor, the gate insulating layer and the channel can be formed through a relatively simple process not in accordance with a photolithography technique (but in accordance with a ink jet technique, a screen printing technique, an intaglio/relief printing technique, a nanoimprinting technique, or the like). Increase in area is also achieved easily. This method for manufacturing the thin film transistor is thus excellent in industrial and mass productivity performance. This method for manufacturing the thin film transistor containing a predetermined amount of zirconium (Zr) or a predetermined amount of lanthanum (La) enables relatively facilitated formation of an amorphous phase, which is difficult with oxide containing indium (In), and can thus achieve manufacture of a thin film transistor including the oxide layer of high flatness. The amorphous phase can be formed relatively easily, so that a preferred interface with the gate insulating layer can be formed. The amorphous phase can be formed relatively easily, so that the layered oxide can have improved formability (e.g. easier imprinting and/or improved accuracy after formation by imprinting).

Another thin film transistor according to the present invention includes a gate electrode, a channel, and a gate insulating layer provided between the gate electrode and the channel and made of oxide (possibly including inevitable impurities) containing lanthanum (La) and zirconium (Zr). The channel is made of fourth oxide (possibly including inevitable impurities) containing indium (In), zinc (Zn), and tin (Sn), or fifth oxide (possibly including inevitable impurities) containing indium (In) and zinc (Zn).

This thin film transistor includes the fourth oxide or the fifth oxide for the channel and the oxide containing lanthanum (La) and zirconium (Zr) for the gate insulating layer, and can thus significantly improve various properties (e.g. electron field-effect mobility, reduction in hysteresis, an ON/OFF ratio, or a subthreshold characteristic (SS)) as a thin film transistor.

Another method for manufacturing a thin film transistor according to the present invention includes a gate insulating layer forming step of forming a gate insulating layer made of oxide (possibly including inevitable impurities) containing lanthanum (La) and zirconium (Zr) by heating, in an atmosphere containing oxygen, a gate insulating layer precursor layer obtained from a gate insulating layer precursor solution as a start material including a precursor containing lanthanum (La) and a precursor containing zirconium (Zr) as solutes, the gate insulating layer being in contact with a gate electrode layer, the gate insulating layer forming step being performed between a step of forming the gate electrode layer and a step of forming the channel by forming channel oxide (possibly including inevitable impurities). In this method for manufacturing the thin film transistor, the step of forming the channel includes a step of heating, in an atmosphere containing oxygen, a channel precursor layer obtained from each of following precursor solutions (1) and (2) as a start material.

(1) a fourth precursor solution including a precursor containing indium (In), a precursor containing zinc (Zn), and a precursor containing tin (Sn) as solutes (2) a fifth precursor solution including a precursor containing indium (In) and a precursor containing zinc (Zn) as solutes In this method for manufacturing the thin film transistor, the step of forming the channel includes a step of forming following channel oxide (3) or (4) by heating, in an atmosphere containing oxygen, the channel precursor layer.

(3) fourth oxide containing indium (In), zinc (Zn), and tin (Sn).

(4) fifth oxide containing indium (In) and zinc (Zn).

This method for manufacturing the thin film transistor, which includes the fourth oxide or the fifth oxide for the channel and the oxide containing lanthanum (La) and zirconium (Zr) for the gate insulating layer, enables manufacture of a thin film transistor having various excellent properties (e.g. electron field-effect mobility, reduction in hysteresis, an ON/OFF ratio, or a subthreshold characteristic (SS)) as a thin film transistor. In this method for manufacturing the thin film transistor, the gate insulating layer and the channel can be formed through a relatively simple process not in accordance with a photolithography technique (but in accordance with a ink jet technique, a screen printing technique, an intaglio/relief printing technique, a nanoimprinting technique, or the like). Increase in area is also achieved easily. This method for manufacturing the thin film transistor is thus excellent in industrial and mass productivity performance. This method for manufacturing the thin film transistor, which includes the fourth oxide or the fifth oxide for the channel and the oxide containing lanthanum (La) and zirconium (Zr) for the gate insulating layer, enables manufacture of a thin film transistor that is durable against use as a device even though the thin film transistor is manufactured through heating processing at a quite low temperature.

In this application, "imprinting" is also called "nanoimprinting".

Effects of the Invention

The present invention provides a high-performance thin film transistor including a gate insulating layer and a channel each made of oxide. The present invention can also provide a method for manufacturing a thin film transistor that includes oxide made through relatively simplified processing. The manufacturing method is thus excellent in industrial and mass productivity performance.

BRIEF DESCRIPTION OF THE DRAWINGS

FIG. 1 is a sectional schematic view of a process in a method for manufacturing a thin film transistor according to each of first to third embodiments of the present invention.

FIG. 2 is a sectional schematic view of a process in the method for manufacturing the thin film transistor according to each of the first to third embodiments of the present invention.

FIG. 3 is a sectional schematic view of a process in the method for manufacturing the thin film transistor according to each of the first to third embodiments of the present invention.

FIG. 4 is a sectional schematic view of a process in the method for manufacturing the thin film transistor according to each of the first to third embodiments of the present invention.

FIG. 5 is a sectional schematic view of a process in the method for manufacturing the thin film transistor according to each of the first to third embodiments of the present invention.

FIG. 6 is a sectional schematic view of a process in the method for manufacturing the thin film transistor according to each of the first to third embodiments of the present invention.

FIG. 7 is a sectional schematic view of a process in the method for manufacturing the thin film transistor according to each of the first to third embodiments of the present invention.

FIG. 8 is a sectional schematic view of a process in the method for manufacturing the thin film transistor according to each of the first to third embodiments of the present invention.

FIG. 9 is a sectional schematic view of the entire configuration of the thin film transistor and a process in the manufacturing method therefor according to each of the first to third embodiments of the present invention.

FIG. 10 is a graph indicating Vg-Id properties of the thin film transistor according to the first embodiment of the present invention.

FIG. 11 is a graph indicating X-ray photoelectron spectroscopy (XPS) analysis results of oxygen atoms included in channel oxide different only in thickness from a channel according to the first embodiment of the present invention.

FIG. 12 is a graph indicating X-ray photoelectron spectroscopy (XPS) analysis results of oxygen atoms included in oxide as a reference measurement target.

FIG. 13 includes views showing AFM images and roughness of surfaces of the channel oxide different only in thickness from the channel according to the first embodiment of the present invention and the oxide as the reference measurement target.

FIG. 14 is a graph indicating Vg-Id properties of a thin film transistor according to a second embodiment of the present invention.

FIG. 15 is a graph indicating Vg-Id properties of a thin film transistor according to a third embodiment of the present invention.

FIG. 16 is a sectional schematic view of a process in a method for manufacturing a thin film transistor according to a fourth embodiment of the present invention.

FIG. 17 is a sectional schematic view of a process in the method for manufacturing the thin film transistor according to the fourth embodiment of the present invention.

FIG. 18 is a sectional schematic view of a process in the method for manufacturing the thin film transistor according to the fourth embodiment of the present invention.

FIG. 19 is a sectional schematic view of a process in the method for manufacturing the thin film transistor according to the fourth embodiment of the present invention.

FIG. 20 is a sectional schematic view of a process in the method for manufacturing the thin film transistor according to the fourth embodiment of the present invention.

FIG. 21 is a sectional schematic view of a process in the method for manufacturing the thin film transistor according to the fourth embodiment of the present invention.

FIG. 22 is a sectional schematic view of the entire configuration of the thin film transistor and a process in the manufacturing method therefor according to the fourth embodiment of the present invention.

FIG. 23 is a sectional schematic view of a process in a method for manufacturing a thin film transistor according to each of a fifth embodiment of the present invention and a modification example thereof.

FIG. 24 is a sectional schematic view of a process in the method for manufacturing the thin film transistor according to each of the fifth embodiment of the present invention and the modification example thereof.

FIG. 25 is a sectional schematic view of a process in the method for manufacturing the thin film transistor according to each of the fifth embodiment of the present invention and the modification example thereof.

FIG. 26 is a sectional schematic view of a process in the method for manufacturing the thin film transistor according to each of the fifth embodiment of the present invention and the modification example thereof.

FIG. 27 is a sectional schematic view of a process in the method for manufacturing the thin film transistor according to each of the fifth embodiment of the present invention and the modification example thereof.

FIG. 28 is a sectional schematic view of a process in the method for manufacturing the thin film transistor according to each of the fifth embodiment of the present invention and the modification example thereof.

FIG. 29 is a sectional schematic view of a process in the method for manufacturing the thin film transistor according to each of the fifth embodiment of the present invention and the modification example thereof.

FIG. 30 is a sectional schematic view of a process in the method for manufacturing the thin film transistor according to each of the fifth embodiment of the present invention and the modification example thereof.

FIG. 31 is a sectional schematic view of a process in the method for manufacturing the thin film transistor according to each of the fifth embodiment of the present invention and the modification example thereof.

FIG. 32 is a sectional schematic view of the entire configuration of the thin film transistor and a process in the manufacturing method therefor according to each of the fifth embodiment of the present invention and the modification example thereof.

FIG. 33 is a graph indicating Vg-Id properties of the thin film transistor according to the fifth embodiment of the present invention.

FIG. 34 is a graph indicating Vg-Id properties of the thin film transistor according to the modification example of the fifth embodiment of the present invention.

FIG. 35 is a sectional schematic view of a process in a method for manufacturing a thin film transistor according to each of a sixth embodiment of the present invention and a modification example thereof.

FIG. 36 is a sectional schematic view of a process in the method for manufacturing the thin film transistor according to each of the sixth embodiment of the present invention and the modification example thereof.

FIG. 37 is a sectional schematic view of a process in the method for manufacturing the thin film transistor according to each of the sixth embodiment of the present invention and the modification example thereof.

FIG. 38 is a sectional schematic view of a process in the method for manufacturing the thin film transistor according to each of the sixth embodiment of the present invention and the modification example thereof.

FIG. 39 is a sectional schematic view of a process in the method for manufacturing the thin film transistor according to each of the sixth embodiment of the present invention and the modification example thereof.

FIG. 40 is a sectional schematic view of the entire configuration of the thin film transistor and a process in the manufacturing method therefor according to each of the sixth embodiment of the present invention and the modification example thereof.

DESCRIPTION OF REFERENCE SIGNS

10 Substrate
20, 224 Gate electrode
222 Gate electrode precursor layer
32, 232 Gate insulating layer precursor layer
34, 234 Gate insulating layer
42, 42a, 42b, 42c, 242, 242a, 242b Channel precursor layer
44, 44a, 44b, 44c, 244, 244a, 244b Channel
250 ITO layer
56, 256 Drain electrode
58, 258 Source electrode
100, 100a, 100b, 100c, 400, 400a, 400b, 400c, 500, 500a, 500b, 600, 600a, 600b Thin film transistor
50 ITO layer
90 Resist film
M1 Gate insulating layer mold
M2 Channel mold
M3 Gate electrode mold
M4 Source/drain electrode mold

EMBODIMENTS OF THE INVENTION

A thin film transistor and a manufacturing method therefor according to each of the embodiments of the present invention will now be described in detail with reference to the accompanying drawings. In this disclosure, common parts are denoted by common reference signs in all the drawings unless otherwise specified. Furthermore, components according to these embodiments are not necessarily illustrated in accordance with relative scaling in the drawings. Moreover, some of the reference signs may not be indicated for the purpose of easier recognition of the respective drawings.

First Embodiment

1. Entire Configuration of Thin Film Capacitor According to the Present Embodiment FIGS. 1 to 8 are sectional schematic views each showing a process in a method for manufacturing a thin film transistor 100 (100a in the present embodiment). FIG. 9 is a sectional schematic view of a process in the method for manufacturing the thin film transistor 100a according to the present embodiment and the entire configuration of the thin film transition. As shown in FIG. 9, the thin film transistor 100a according to the present embodiment includes a gate electrode 20, a gate insulating layer 34, a channel 44 (a channel 44a in the present embodiment), and a source electrode 58 as well as a drain electrode 56, which are laminated in this order from the lower side on a substrate 10.

Although the thin film transistor 100a has a so-called bottom gate structure, the present embodiment is not limited to this structure. If a person skilled in the art having ordinary technical knowledge refers to the disclosure of the present embodiment, the person can form a top gate structure by changing the orders of the steps. Temperatures indicated in this application relate to surface temperatures of a heating side of a heater in contact with the substrate. Patterning of an extraction electrode from each electrode is not illustrated in order for simplification of the drawings.

The substrate 10 can be made of any one of various insulating base materials including highly heat resistant glass, an $SiO_2/Si$ substrate (i.e. a silicon substrate provided thereon with a silicon oxide film; hereinafter, also simply referred to as a "substrate"), an alumina ($Al_2O_3$) substrate, an STO (SrTiO) substrate, and a semiconductor substrate (e.g. an Si substrate, an SiC substrate, or a Ge substrate) such as an insulating substrate obtained by forming an STO (SrTiO) layer on a surface of an Si substrate with an $SiO_2$ layer and a Ti layer being interposed therebetween.

The gate electrode 20 can be made of any one of metallic materials including high melting metal such as platinum, gold, silver, copper, aluminum, molybdenum, palladium, ruthenium, iridium, and tungsten, alloy thereof, and the like.

The gate insulating layer 34 in the thin film transistor 100a according to the present embodiment is made of oxide containing lanthanum (La) and zirconium (Zr) (possibly including inevitable impurities; this applies to oxide as a different material in addition to the oxide as this material). When an atomic ratio of zirconium (Zr) to lanthanum (La) in the gate insulating layer 34 is particularly 0.25 or more and 4 or less relative to lanthanum (La) assumed to be 1 in atomic ratio, the transistor can achieve highly reliable performance. The gate insulating layer 34 is also called an LZO layer.

The gate insulating layer 34 according to the present embodiment is preferably 50 nm or more and 300 nm or less in thickness. Although the gate insulating layer 34 has no particular upper limit in thickness, the gate insulating layer 34 having a thickness exceeding 300 nm can possibly affect interfacial properties of the channel and is thus not preferred. The gate insulating layer 34 having a thickness of less than 50 nm may cause increase in leakage current, decrease in coatability of the film to the substrate, and the like and is thus not preferred.

The gate insulating layer 34 preferably has relative permittivity of 3 or more and 100 or less. The gate insulating layer 34 having relative permittivity exceeding 100 increases a time constant and accordingly inhibits quick motion of the transistor, whereas the gate insulating layer 34 having relative permittivity less than 3 may decrease charge induced by the gate insulating film and deteriorate the device properties. The gate insulating layer 34 having thickness out of this range is thus not preferred. In view of the above, the relative permittivity is more preferably 15 or more and 30 or less.

The channel 44a according to the present embodiment is made of channel oxide (first oxide in the present embodiment) containing indium (In), zinc (Zn), and zirconium (Zr). The channel oxide contains zirconium (Zr) having an atomic ratio of 0.015 or more and 0.075 less relative to indium (In) assumed to be 1 in atomic ratio. As to be described later, when the channel 44a in the thin film transistor contains zirconium (Zr) having an atomic ratio of 0.015 or more and 0.075 or less relative to indium (In) assumed to be 1 in atomic ratio, the thin film transistor can suppress excessive oxygen deficiency that is difficult to be suppressed by oxide containing indium (In) and zinc (Zn). Such a thin film transistor can significantly improve various properties (e.g. reduction in hysteresis, an ON/OFF ratio, or a subthreshold characteristic (SS)).

The channel oxide according to the present embodiment has an amorphous phase, so that the channel oxide will achieve a preferred interfacial state with the gate insulating layer 34 in contact with the channel 44a. The obtained thin film transistor will thus have preferred electrical properties. The channel 44a made of channel oxide containing indium (In), zinc (Zn), and zirconium (Zr) is also called a ZIZO layer.

In the thin film transistor according to a preferred aspect, the channel 44a has thickness of 5 nm or more and 80 nm or less because such a channel 44a highly reliably covers the gate insulating layer 34 and the like and facilitates channel conductivity modulation.

The source electrode 58 and the drain electrode 56 according to the present embodiment are each made of indium tin oxide (ITO).

2. Method for Manufacturing Thin Film Transistor 100a

(1) Formation of Gate Electrode

As shown in FIG. 1, the gate electrode 20 is initially formed on an $SiO_2/Si$ substrate (hereinafter, also simply referred to as a "substrate") 10 in accordance with a known sputtering technique.

(2) Formation of Gate Insulating Layer

As shown in FIG. 2, subsequently formed on the gate electrode 20 in accordance with a known spin coating technique is a gate insulating layer precursor layer 32 from a gate insulating layer precursor solution as a start material including a precursor containing lanthanum (La) and a precursor containing zirconium (Zr) as solutes.

Examples of the precursor containing lanthanum (La) for gate insulating layer oxide according to the present embodiment include lanthanum acetate. The examples can also include lanthanum nitrate, lanthanum chloride, and any lanthanum alkoxide (e.g. lanthanum isopropoxide, lanthanum butoxide, lanthanum ethoxide, or lanthanum methoxyethoxide). Examples of the precursor containing zirconium (Zr) for the gate insulating layer oxide according to the present embodiment include zirconium butoxide. The examples can also include zirconium nitrate, zirconium chloride, and any other zirconium alkoxide (e.g. zirconium isopropoxide, zirconium butoxide, zirconium ethoxide, or zirconium methoxyethoxide).

The precursor layer is then heated at a temperature of 80° C. or more and 250° C. or less for a predetermined time period so as to be preliminarily baked. This preliminary baking can sufficiently evaporate a solvent in the gate insulating layer precursor layer 32 and cause a preferred gel state for exertion of properties that enable future plastic deformation (possibly a state where organic chains remain before thermal decomposition). The preliminary baking is performed preferably at a temperature of 80° C. or more and 250° C. or less in order to more reliably achieve the above states. This temperature range is preferred also for preliminary baking of a different material.

This preliminary baking is performed in an oxygen atmosphere or in the atmosphere (hereinafter, also collectively referred to as an "atmosphere containing oxygen"). In the present embodiment, formation of a gate insulating layer precursor layer 32 according to a spin coating technique and preliminary baking described above are repeated multiple times so that the gate insulating layer 34 to be finally obtained has sufficient thickness (e.g. about 125 nm). The gate insulating layer precursor layer 32 is further heated at a temperature of 350° C. or more and 550° C. or less in an oxygen atmosphere (e.g. 100 percent by volume but not limited thereto; this applies to an "oxygen atmosphere" hereinafter) for a predetermined time period so as to be mainly baked. As shown in FIG. 3, formed on the gate electrode 20 is the gate insulating layer 34 made of oxide containing lanthanum (La) and zirconium (Zr).

The gate insulating layer 34 according to the present embodiment is formed by baking the gate insulating layer precursor solution including the precursor containing lanthanum (La) and the precursor containing zirconium (Zr) as solutes. In this application, the above described technique for forming the gate insulating layer 34 or a different oxide layer by baking a precursor solution as a start material is also called a "solution technique" for the convenience purpose.

(3) Formation of Channel

As shown in FIG. 4, a channel precursor layer 42a is then formed on the gate insulating layer 34 in accordance with a known spin coating technique. In the present embodiment, the channel precursor layer 42a is formed from a channel precursor solution (a first precursor solution in the present embodiment) as a start material including, as solutes, a precursor containing indium (In), a precursor containing zinc (Zn), and a precursor containing zirconium (Zr) having an atomic ratio of 0.015 or more and 0.075 or less relative to the indium (In) assumed to be 1 in atomic ratio.

The channel precursor layer 42a is then heated at a temperature of 80° C. or more and 250° C. or less for a predetermined time period so as to be preliminarily baked. The channel precursor layer 42a is further heated at a temperature of 350° C. or more and 550° C. or less in an oxygen atmosphere for a predetermined time period so as to be mainly baked. As shown in FIG. 5, formed on the gate insulating layer 34 is the channel 44a made of oxide containing indium (In), zinc (Zn), and zirconium (Zr).

Examples of the precursor containing indium (In) for the channel 44a according to the present embodiment include indium acetylacetonate. The examples can also include indium acetate, indium nitrate, indium chloride, and any indium alkoxide (e.g. indium isopropoxide, indium butoxide, indium ethoxide, or indium methoxyethoxide). Examples of the precursor containing zinc (Zn) for the channel 44a according to the present embodiment include zinc chloride. The examples can also include zinc chloride, zinc nitrate, zinc acetate, and any zinc alkoxide (e.g. zinc isopropoxide, zinc butoxide, zinc ethoxide, or zinc methoxyethoxide). Examples of the precursor containing zirconium (Zr) for the channel 44a according to the present embodiment include zirconium butoxide. The examples can also include zirconium nitrate, zirconium chloride, and any other zirconium alkoxide (e.g. zirconium isopropoxide, zirconium butoxide, zirconium ethoxide, or zirconium methoxyethoxide).

(4) Formation of Source Electrode and Drain Electrode

As shown in FIG. 6, further formed on the channel 44a is a resist film 90 patterned in accordance with a known photolithography technique. An ITO layer 50 is then formed on the channel 44a and the resist film 90 in accordance with a known sputtering technique. Examples of a target material according to the present embodiment include ITO that contains 5 wt % of tin oxide ($SnO_2$) and is formed at a room temperature. The resist film 90 is then removed. As shown in FIG. 7, formed on the channel 44a is the drain electrode 56 and the source electrode 58 each made of the ITO layer 50.

A resist film 90 patterned in accordance with a known photolithography technique is then formed on the drain electrode 56, the source electrode 58, and the channel 44a. Exposed portions of the channel 44a are thereafter removed in accordance with a known dry etching technique using argon (Ar) plasma while the resist film 90, part of the drain electrode 56, and part of the source electrode 58 serve as masks. The patterned channel 44a is thus formed, so that the thin film transistor 100a is manufactured.

3. Properties of Thin Film Transistor 100a

An example 1 is provided below to describe the first embodiment in more detail. The present embodiment is, however, not limited to this example. The properties of the thin film transistor 100a were checked in the following manner in the example 1.

Example 1

In the example 1, initially formed on the substrate 10 was a platinum (Pt) layer of 200 nm in thickness as the gate electrode 20. The platinum layer was formed in accordance with a known sputtering technique. A $TiO_x$ film (not shown) of about 10 nm in thickness is formed on $SiO_2$ in the example 1.

Subsequently formed on a gate electrode layer in accordance with a known spin coating technique is the gate insulating layer precursor layer 32 from a gate insulating layer precursor solution as a start material including a precursor containing lanthanum (La) and a precursor containing zirconium (Zr) as solutes. The precursor containing lanthanum (La) is lanthanum acetate. The precursor containing zirconium (Zr) is zirconium butoxide. The precursor layer is then heated to 250° C. for about five minutes so as to be preliminarily baked. Formation of a precursor layer according to a spin coating technique and preliminary baking were repeated five times in the example 1.

The precursor layer was further heated to 550° C. in an oxygen atmosphere for about 20 minutes so as to be mainly baked. The gate insulating layer 34 was thus obtained. The gate insulating layer 34 was about 125 nm in thickness. The thickness of each of the layers was obtained as a difference in height between the corresponding layer and the substrate 10 in accordance with a tracer technique. The gate insulating layer 34 according to the present example is made of oxide containing lanthanum (La) and zirconium (Zr) having an atomic ratio of 0.25 or more and 4 or less relative to lanthanum (La) assumed to be 1 in atomic ratio.

The channel precursor layer 42a was then formed on the gate insulating layer 34 in accordance with a known spin coating technique from the channel precursor solution (the first precursor solution) as a start material including the precursor containing indium (In), the precursor containing zinc (Zn), and the precursor containing zirconium (Zr) as solutes. Indium acetylacetonate was used as the precursor containing indium (In) for the channel precursor layer 42a. Zinc butoxide was used as the precursor containing zinc (Zn) for the channel precursor layer 42a. Zirconium butoxide was used as the precursor containing zirconium (Zr).

The channel precursor layer is then heated to 250° C. for about five minutes so as to be preliminarily baked. The channel precursor layer was further heated at 500° C. in an oxygen atmosphere for about ten minutes so as to be mainly baked. Formed was a channel oxide layer containing indium (In), zinc (Zn), and zirconium (Zr). The channel oxide layer according to the example 1 contained indium (In), zinc (Zn), and zirconium (Zr) at the atomic ratio of 1:0.5:0.05 when indium (In) was assumed to be 1 in atomic ratio. The channel oxide layer was about 20 nm in thickness. A source electrode and a drain electrode were then formed in the manner same as that of the first embodiment.

(1) Current-Voltage Properties

FIG. 10 is a graph indicating Vg-Id properties of the thin film transistor 100a. Reference sign $V_D$ in FIG. 10 denotes a voltage (V) that is applied between the source electrode 58 and the drain electrode 56 of the thin film transistor 100a.

Table 1 indicates a subthreshold characteristic (SS), electron field-effect mobility ($\mu_{FE}$), and an ON/OFF ratio of the thin film transistor 100*a*.

TABLE 1

| Channel oxide | Gate insulating layer oxide | | |
|---|---|---|---|
| | SS (mV/dec.) | $\mu_{FE}$ (cm²/Vs) | ON/OFF |
| LaZrO/ZrInZnO | 600 | 4 | >10⁹ |

As indicated in FIG. 10 and Table 1, the Vg-Id properties of the thin film transistor 100*a* according to the first embodiment were checked to find that the subthreshold characteristic (SS) was 600 mV/dec. and the electron field-effect mobility ($\mu_{FE}$) was 4 cm²/Vs. The ON/OFF ratio was of the order of more than $10^8$. The thin film transistor 100*a* includes the gate insulating layer and the channel each of which is an oxide layer and formed in accordance with a solution technique. The thin film transistor 100*a* was found to sufficiently exert the functions as a transistor. Main baking was performed at 500° C. in this example. The inventors found through a test that main baking performed at a heating temperature of 350° C. or more and 500° C. or less achieves the functions as a transistor. Also found was that main baking performed at a heating temperature of 450° C. or more and 500° C. or less improves stability of the electrical properties of the transistor.

(2) Relative Permittivity

Relative permittivity was measured in the example 1 using the broadband permittivity measurement system 1260-SYS manufactured by TOYO Corporation. Measurement was performed to find that the oxide of the gate insulating layer had relative permittivity of approximately 20 or more and 25 or less.

(3) Crystal Structure Analysis by XRD Analysis

The channel according to the example 1 was analyzed using an X-ray diffraction (XRD) apparatus. No distinctive peak was observed. The channel oxide configuring the channel was thus found to have an amorphous phase. The channel oxide (the first oxide) according to the present example contains zirconium (Zr) and can thus form an amorphous phase relatively easily. The layer made of the oxide can thus have higher flatness. The amorphous phase can be formed relatively easily, so that a preferred interface with the gate insulating layer can be formed.

(4) Analysis of Oxygen Atoms in Oxide Using XPS Measurement Apparatus

Oxygen atoms included in channel oxide different only in thickness from the channel according to the example 1 were analyzed using an X-ray photoelectron spectroscopy (XPS) measurement apparatus. Specifically, analyzed is oxide of about 30 nm in thickness, containing indium (In), zinc (Zn), and zirconium (Zr). This oxide can thus be regarded as substantially channel oxide (the first oxide).

FIG. 11 is a graph indicating XPS analysis results of the oxygen atoms included in the oxide containing indium (In), zinc (Zn), and zirconium (Zr). FIG. 12 is a graph indicating XPS analysis results of oxygen atoms included in oxide as a reference measurement target. This reference measurement target is oxide containing indium (In) and zinc (Zn) (thus containing no zirconium (Zr)), and is formed in accordance with a solution technique similar to that of the first embodiment except for the difference in material. FIGS. 11 and 12 indicate lines (a1) and (a2), respectively, each of which is considered as having a peak caused by metal-oxygen bonding. In a case of a ZIZO layer, the peaks of the line (a1) in FIG. 11 and the line (a2) in FIG. 12 are each considered as indicating bonding between $O^{2-}$ and Zr, In, or Zn. FIGS. 11 and 12 indicate lines (c1) and (c2), respectively, each of which is considered as having a peak caused by weak bonding of oxygen contained in $H_2O$, $O_2$, or $CO_2$ in the oxide at a surface thereof. FIGS. 11 and 12 indicate lines (b1) and (b2), respectively, each of which has a peak of 531 eV or more and 532 eV or less (also expressed at around 531 eV). This peak is considered as reflecting an oxygen deficiency condition in the oxide or being caused by the oxygen deficiency condition in the oxide.

As indicated in FIGS. 11 and 12, oxide containing zirconium (Zr) is found to have a smaller peak at around 531.9 eV, as compared with that of oxide containing no zirconium (Zr).

More specifically, the number of oxygen atoms causing the peak at around 531.9 eV on the line (b1) indicated in FIG. 11 was 0.200 relative to the total number of oxygen atoms assumed to be 1. The number of oxygen atoms causing the peak at around 531.9 eV on the line (b2) indicated in FIG. 12 was 0.277 relative to the total number of oxygen atoms assumed to be 1.

The inventors further analyzed to find that the peak at around 531.9 eV was decreased as the content of zirconium (Zr) in the oxide was increased. The condition for the peak on the line (b1) in FIG. 11 is thus considered as suppressing oxygen deficiency. The condition for the peak on the line (b1) in FIG. 11 is thus considered as contributing to adjustment to carrier density appropriate for operating a transistor as well as to improvement in property of the interface with the gate insulating film. Particularly when the number of oxygen atoms causing the peak within the range of 531 eV or more and 532 eV or less is 0.19 or more and 0.21 or less relative to the total number of oxygen atoms assumed to be 1, excessive oxygen deficiency is suppressed. This condition thus contributes to improvement of various properties (e.g. reduction in hysteresis, an ON/OFF ratio, or a subthreshold characteristic (SS)) as a thin film transistor.

(5) AFM Observation of Oxide Surface and Analysis of Surface Roughness

Further executed were observation of an atomic force microscopy (AFM) image and analyses on surface roughness of the channel oxide different only in thickness from the channel according to the example 1. FIG. 13 includes views showing AFM images and roughness of surfaces of the channel oxide and the oxide as the reference measurement target.

Specifically, similarly to the XPS analysis results, analyzed is oxide (a sample A in FIG. 13) of about 30 nm in thickness, containing indium (In), zinc (Zn), and zirconium (Zr). This oxide can thus also be regarded as substantially channel oxide (the first oxide). Also analyzed as the reference measurement target was oxide (a sample B in FIG. 13) containing indium (In) and zinc (Zn) (thus containing no zirconium (Zr)) and formed in accordance with a solution technique similar to that of the first embodiment except for the difference in material.

As indicated in FIG. 13, in view of surface roughness, the oxide containing zirconium (Zr) was found to have a root mean square (RMS) value smaller than that of oxide containing no zirconium (Zr). The inventors further analyzed to find that the RMS value was decreased as the content of zirconium (Zr) in the oxide was increased. The channel according to the example 1 was thus found to have flatness improved by zirconium (Zr) contained therein. Such high flatness can contribute to improvement in dimensional accuracy for formation of a thin film transistor having a lamination structure as well as to improvement in property of the interface between a channel and a gate insulating film.

As described above, the thin film transistor 100a according to the present embodiment was found to possibly achieve the preferred electrical properties as a thin film transistor. In the method for manufacturing the thin film transistor 100a according to the present embodiment, the gate insulating layer and the channel are made of oxide and formed in accordance with a solution technique. This manufacturing method thus facilitates increase in area and significantly improves industrial and mass productivity performance as compared with a conventional method.

Second Embodiment

1. Entire Configuration of Thin Film Capacitor According to the Present Embodiment FIGS. 1 to 8 are sectional schematic views each showing a process in a method for manufacturing a thin film transistor 100b according to the present embodiment. FIG. 9 is a sectional schematic view showing a process in the method for manufacturing the thin film transistor 100b according to the present embodiment as well as the entire configuration thereof.

The present embodiment is similar to the first embodiment except that the thin film transistor 100b includes a channel 44b made of channel oxide containing indium (In) and zirconium (Zr). Only different portions in the configuration of the thin film transistor 100b are thus to be described as compared with the configuration according to the first embodiment in FIG. 9.

As shown in FIG. 9, the thin film transistor 100b according to the present embodiment includes the gate electrode 20, the gate insulating layer 34, the channel 44 (the channel 44b in the present embodiment), and the source electrode 58 as well as the drain electrode 56, which are laminated in this order from the lower side on the substrate 10.

The channel 44b is made of channel oxide (second oxide in the present embodiment) containing indium (In) and zirconium (Zr). The channel oxide contains zirconium (Zr) having an atomic ratio of 0.055 or more and 0.16 or less relative to indium (In) assumed to be 1 in atomic ratio. When the channel 44b in the thin film transistor contains zirconium (Zr) having an atomic ratio of 0.055 or more and 0.16 or less relative to indium (In) assumed to be 1 in atomic ratio, the thin film transistor can suppress excessive oxygen deficiency that is difficult to be suppressed by oxide containing indium (In). Such a thin film transistor can significantly improve various properties (e.g. reduction in hysteresis, an ON/OFF ratio, or a subthreshold characteristic (SS)). The channel 44b made of channel oxide containing indium (In) and zirconium (Zr) is also called an IZO layer.

2. Method for Manufacturing Thin Film Transistor 100b

As shown in FIG. 4, a channel precursor layer 42b is formed on the gate insulating layer 34 in accordance with a known spin coating technique also in the method for manufacturing the thin film transistor 100b. In the present embodiment, the channel precursor layer 42b is formed from a channel precursor solution (a second precursor solution in the present embodiment) as a start material including, as solutes, a precursor containing indium (In) and a precursor containing zirconium (Zr) having an atomic ratio of 0.055 or more and 0.16 or less relative to the indium (In) assumed to be 1 in atomic ratio.

The channel precursor layer 42b is then heated at a temperature in the range of 80° C. or more and 250° C. or less for a predetermined time period so as to be preliminarily baked. The channel precursor layer 42b is further heated at a temperature in the range of 350° C. or more and 550° C. or less in an oxygen atmosphere for a predetermined time period so as to be mainly baked. As shown in FIG. 5, formed on the gate insulating layer 34 is the channel 44b made of oxide containing indium (In) and zirconium (Zr). Examples of the precursor containing indium (In) or zirconium (Zr) are the same as those of the first embodiment.

3. Properties of Thin Film Transistor 100b

An example 2 is provided below to describe the second embodiment in more detail. The present embodiment is, however, not limited to this example. The properties of the thin film transistor 100b were checked in the following manner in the example 2.

Example 2

Indium acetylacetonate was used as the precursor containing indium (In) for the channel oxide layer in the example 2. Zirconium butoxide was used as the precursor containing zirconium (Zr) for the channel oxide layer. Other than the above, the thin film transistor 100b was manufactured under the conditions similar to those of the example 1. The channel oxide layer contained indium (In) and zirconium (Zr) having the atomic ratio of 0.11 relative to indium (In) assumed to be 1 in atomic ratio. The channel oxide layer was about 20 nm in thickness.

(1) Current-Voltage Properties

FIG. 14 is a graph indicating Vg-Id properties of the thin film transistor 100b. Reference sign $V_D$ in FIG. 14 denotes a voltage (V) that is applied between the source electrode 58 and the drain electrode 56 of the thin film transistor 100b. Table 2 indicates a subthreshold characteristic (SS), electron field-effect mobility ($\mu_{FE}$), and an ON/OFF ratio of the thin film transistor 100b.

TABLE 2

| | Gate insulating layer oxide | | |
|---|---|---|---|
| Channel oxide | SS (mV/dec.) | $\mu_{FE}$ (cm$^2$/Vs) | $\dfrac{ON}{OFF}$ |
| LaZrO/ZrInO | 75 | 102 | $10^6 \sim 10^7$ |

As indicated in FIG. 14 and Table 2, the Vg-Id properties of the thin film transistor 100b according to the second embodiment were checked to find that the subthreshold characteristic (SS) was 75 mV/dec. and the electron field-effect mobility ($\mu_{FE}$) was 102 cm$^2$/Vs. The ON/OFF ratio was of the order of about $10^6$ to $10^7$. The thin film transistor 100b was thus found to exert the preferred properties as a transistor.

(2) Relative Permittivity

Measurement was performed to find that the oxide of the gate insulating layer according to the example 2 had relative permittivity of approximately 20 or more and 25 or less.

(3) Crystal Structure Analysis by XRD Analysis

The channel according to the example 2 was analyzed using an X-ray diffraction (XRD) apparatus. No distinctive peak was observed. The channel oxide configuring the channel was thus found to have an amorphous phase. The channel oxide (the second oxide) according to the present example contains zirconium (Zr) and can thus form an amorphous phase relatively easily. The layer made of the oxide can thus have higher flatness. The amorphous phase can be formed relatively easily, so that a preferred interface with the gate insulating layer can be formed.

As described above, the thin film transistor 100b according to the present embodiment was found to possibly achieve the preferred electrical properties as a thin film transistor. In the method for manufacturing the thin film transistor 100b according to the present embodiment, the gate insulating layer and the channel are made of oxide and formed in accordance with a solution technique. This manufacturing method thus facilitates increase in area and significantly improves industrial and mass productivity performance as compared with a conventional method.

Third Embodiment

1. Entire Configuration of Thin Film Capacitor According to the Present Embodiment FIGS. 1 to 8 are sectional schematic views each showing a process in a method for manufacturing a thin film transistor 100c according to the present embodiment. FIG. 9 is a sectional schematic view showing a process in the method for manufacturing the thin film transistor 100c according to the present embodiment as well as the entire configuration thereof.

The present embodiment is similar to the first embodiment except that the thin film transistor 100c includes a channel 44c made of channel oxide containing indium (In) and lanthanum (La). Only different portions in the configuration of the thin film transistor 100c are thus to be described as compared with the configuration according to the first embodiment in FIG. 9.

As shown in FIG. 9, the thin film transistor 100c according to the present embodiment includes the gate electrode 20, the gate insulating layer 34, the channel 44 (the channel 44c in the present embodiment), and the source electrode 58 as well as the drain electrode 56, which are laminated in this order from the lower side on the substrate 10.

The channel 44c is made of channel oxide (third oxide in the present embodiment) containing indium (In) and lanthanum (La). The channel oxide contains lanthanum (La) having an atomic ratio of 0.055 or more and 0.16 or less relative to indium (In) assumed to be 1 in atomic ratio. When the channel 44c in the thin film transistor contains lanthanum (La) having an atomic ratio of 0.055 or more and 0.16 or less relative to indium (In) assumed to be 1 in atomic ratio, the thin film transistor can suppress excessive oxygen deficiency that is difficult to be suppressed by oxide containing indium (In). Such a thin film transistor can significantly improve various properties (e.g. reduction in hysteresis, an ON/OFF ratio, or a subthreshold characteristic (SS)). The channel 44c made of channel oxide containing indium (In) and lanthanum (La) is also called an LIO layer.

2. Method for Manufacturing Thin Film Transistor 100c

As shown in FIG. 4, a channel precursor layer 42c is formed on the gate insulating layer 34 in accordance with a known spin coating technique also in the method for manufacturing the thin film transistor 100c. In the present embodiment, the channel precursor layer 42c is formed from a channel precursor solution (a third precursor solution in the present embodiment) as a start material including, as solutes, a precursor containing indium (In) and a precursor containing lanthanum (La) having an atomic ratio of 0.055 or more and 0.16 or less relative to the indium (In) assumed to be 1 in atomic ratio.

The channel precursor layer 42c is then heated at a temperature in the range of 80° C. or more and 250° C. or less for a predetermined time period so as to be preliminarily baked. The channel precursor layer 42c is further heated at a temperature in the range of 350° C. or more and 550° C. or less in an oxygen atmosphere for a predetermined time period so as to be mainly baked. As shown in FIG. 5, formed on the gate insulating layer 34 is the channel 44c made of oxide containing indium (In) and lanthanum (La). Examples of the precursor containing indium (In) or lanthanum (La) are the same as those of the first embodiment.

3. Properties of Thin Film Transistor 100c

An example 3 is provided below to describe the third embodiment in more detail. The present embodiment is, however, not limited to this example. The properties of the thin film transistor 100c were checked in the following manner in the example 3.

Example 3

Indium acetylacetonate was used as the precursor containing indium (In) for the channel oxide layer in the example 3. Lanthanum acetate was used as the precursor containing lanthanum (La) for the channel oxide layer. Other than the above, the thin film transistor 100c was manufactured under the conditions similar to those of the example 1. The channel oxide layer contained indium (In) and lanthanum (La) having the atomic ratio of 0.11 relative to indium (In) assumed to be 1 in atomic ratio. The channel oxide layer was about 20 nm in thickness.

(1) Current-Voltage Properties

FIG. 15 is a graph indicating Vg-Id properties of the thin film transistor 100c. Reference sign $V_D$ in FIG. 15 denotes a voltage (V) that is applied between the source electrode 58 and the drain electrode 56 of the thin film transistor 100c. Table 3 indicates a subthreshold characteristic (SS), electron field-effect mobility ($\mu_{FE}$), and an ON/OFF ratio of the thin film transistor 100c.

TABLE 3

| | Gate insulating layer oxide | | |
| --- | --- | --- | --- |
| Channel oxide | SS (mV/dec.) | $\mu_{FE}$ (cm$^2$/Vs) | $\dfrac{ON}{OFF}$ |
| LaZrO/LaInO | 64 | 51 | $10^6 \sim 10^7$ |

As indicated in FIG. 15 and Table 3, the Vg-Id properties of the thin film transistor 100c according to the third embodiment were checked to find that the subthreshold characteristic (SS) was 64 mV/dec. and the electron field-effect mobility ($\mu_{FE}$) was 51 cm$^2$/Vs. The ON/OFF ratio was of the order of about $10^6$ to $10^7$. The thin film transistor 100c was thus found to exert the preferred properties as a transistor.

(2) Relative Permittivity

Measurement was performed to find that the oxide of the gate insulating layer according to the example 3 had relative permittivity of approximately 20 or more and 25 or less.

(3) Crystal Structure Analysis by XRD Analysis

The channel according to the example 3 was analyzed using an X-ray diffraction (XRD) apparatus. No distinctive peak was observed. The channel oxide configuring the channel was thus found to have an amorphous phase. The channel oxide (the third oxide) according to the present example contains zirconium (Zr) and can thus form an amorphous phase relatively easily. The layer made of the oxide can thus have higher flatness. The amorphous phase can be formed relatively easily, so that a preferred interface with the gate insulating layer can be formed.

As described above, the thin film transistor 100c according to the present embodiment was found to possibly achieve the preferred electrical properties as a thin film transistor. In the method for manufacturing the thin film transistor 100c according to the present embodiment, the gate insulating layer and the channel are made of oxide and formed in accordance with a solution technique. This manufacturing method thus facilitates increase in area and significantly improves industrial and mass productivity performance as compared with a conventional method.

Fourth Embodiment

The present embodiment is similar to the first embodiment except that imprinting is performed during formation of part of the layers in the first embodiment. Accordingly, the disclosure duplicating with that of the first embodiment may not be provided repeatedly.

1. Method for Manufacturing Thin Film Transistor 400a

FIGS. 16 to 21 are sectional schematic views each showing a process in a method for manufacturing a thin film transistor 400 (400a in the present embodiment). FIG. 22 is a sectional schematic view showing a process in the method for manufacturing the thin film transistor 400a according to the present embodiment as well as the entire configuration thereof. Patterning of an extraction electrode from each electrode is not illustrated in order for simplification of the drawings.

(1) Formation of Gate Electrode

As shown in FIG. 16, the gate electrode 20 is initially formed on the substrate 10 in accordance with a known sputtering technique, a photolithography technique, and an etching technique. The gate electrode 20 according to the present embodiment is made of platinum (Pt).

(2) Formation of Gate Insulating Layer

Similarly to the first embodiment, subsequently formed on the substrate 10 and the gate electrode 20 is the gate insulating layer precursor layer 32 from a precursor solution as a start material including a precursor containing lanthanum (La) and a precursor containing zirconium (Zr) as solutes. The precursor layer is then preliminarily baked in a state where the precursor layer is heated to a temperature of 80° C. or more and 250° C. or less in an atmosphere containing oxygen.

The gate insulating layer precursor layer 32 simply preliminarily baked is imprinted in the present embodiment. Specifically, as shown in FIG. 17, imprinting is performed using a gate insulating layer mold M1 with a pressure of 1 MPa or more and 20 MPa or less in a state where the precursor layer is heated to a temperature of 80° C. or more and 300° C. or less so as to pattern the gate insulating layer. The gate insulating layer precursor layer 32 of about 50 nm to about 300 nm in thickness is thus formed using the gate insulating layer mold M1 according to the present embodiment.

The gate insulating layer precursor layer 32 is then entirely etched, so that the gate insulating layer precursor layer 32 is removed in the regions other than a region corresponding to the gate insulating layer as shown in FIG. 18 (the step of entirely etching the gate insulating layer precursor layer 32). The step of etching the gate insulating layer precursor layer 32 in the present embodiment was executed in accordance with a wet etching technique without including a vacuum process. The etching can be possibly performed in accordance with a so-called dry etching technique using plasma.

The precursor layer is then heated at a temperature of 500° C. or more and 600° C. or less for a predetermined time period so as to be mainly baked. As shown in FIG. 19, the gate insulating layer 34 is formed on the substrate 10 and the gate electrode 20.

(3) Formation of Channel

The channel precursor layer 42 (42a in the present embodiment) simply preliminarily baked is imprinted. Similarly to the first embodiment, the channel precursor layer 42a is initially formed on the gate insulating layer 34 and the substrate 10 from the channel precursor solution as a start material including the precursor containing indium (In), the precursor containing zinc (Zn), and the precursor containing zirconium (Zr) as solutes. Similarly to the first embodiment, the channel precursor layer 42a is then heated at a temperature in the range of 350° C. or more and 550° C. or less for a predetermined time period so as to be preliminarily baked.

As shown in FIG. 20, the channel precursor layer 42a is then imprinted using a channel mold M2 with a pressure of 1 MPa or more and 20 MPa or less in a state where the channel precursor layer 42a is heated to a temperature of 80° C. or more and 300° C. or less. The channel precursor layer 42a is thus formed to be about 50 nm or more and about 300 nm or less in thickness. The precursor layer is then heated at a temperature in the range of 350° C. or more and 550° C. or less for a predetermined time period so as to be mainly baked. As shown in FIG. 21, formed on the gate insulating layer 34 is the channel 44 (the channel 44a in the present embodiment) containing indium (In), zinc (Zn), and zirconium (Zr).

(4) Formation of Source Electrode and Drain Electrode

Similarly to the first embodiment, a resist film patterned in accordance with a known photolithography technique is then formed on the channel 44a. An ITO layer is thereafter formed on the channel 44a and the resist film in accordance with a known sputtering technique. The resist film is then removed. As shown in FIG. 22, formed on the channel 44a are the drain electrode 56 and the source electrode 58 each made of the ITO layer.

The precursor layer having high plastic deformability is imprinted in the present embodiment. Even in a case where a low pressure of 1 MPa or more and 20 MPa or less is applied for imprinting, each of the precursor layers is deformed so as to follow the shape of the surface of the mold and a desired imprinted structure can be formed highly accurately. When the pressure is set to the low range of 1 MPa or more and 20 MPa or less, the mold is less likely to be damaged by imprinting and increase in area can be advantageously achieved.

The above pressure was set to the range of "1 MPa or more and 20 MPa or less" for the following reasons. Firstly, if the pressure is less than 1 MPa, each of the precursor layers may not be imprinted because the pressure is too low. In contrast, the precursor layer can be sufficiently imprinted with the pressure as high as 20 MPa, and there is no need to increase the pressure. In view of the above, in the imprinting step according to the fourth embodiment, imprinting is performed more preferably with a pressure in the range of 2 MPa or more and 10 MPa or less.

Although the gate insulating layer 34 and the channel 44a according to the first embodiment are imprinted in the fourth embodiment, imprinting targets are not limited thereto. For example, the gate insulating layer 34 and the channel 44b or 44c according to the second or third embodiment can be imprinted to form the imprinted structure. FIGS. 16 to 22 each show a process in a method for manufacturing a thin film transistor 400b, including imprinting during formation of the gate insulating layer 34 and the channel 44b according to the second embodiment or the entire configuration of the thin film transistor 400b, as well as a process in a method for manufacturing a thin film transistor 400c, including imprinting during formation of the gate insulating layer 34 and the channel 44c according to the third embodiment or the entire configuration of the thin film transistor 400c.

As described above, the present embodiment includes the "imprinting step" of imprinting the gate insulating layer 34 and the channel 44 to form an imprinted structure. By including the imprinting step, the present embodiment does not need to include a process requiring relatively a long time period and/or expensive equipment, such as a vacuum process, a process in accordance with a photolithography technique, or an ultraviolet irradiation process. The thin film transistor 400 and the manufacturing method therefor are thus quite excellent in industrial and mass productivity performance.

Fifth Embodiment

1. Entire Configuration of Thin Film Capacitor According to the Present Embodiment FIGS. 23 to 31 are sectional schematic views each showing a process in a method for manufacturing a thin film transistor 500 (500a in the present embodiment). FIG. 32 is a sectional schematic view showing a process in the method for manufacturing the thin film transistor 500a according to the present embodiment as well as the entire configuration thereof. As shown in FIG. 32, the thin film transistor 500a according to the present embodiment includes a gate electrode 224, a gate insulating layer 234, a channel 244 (a channel 244a in the present embodiment), and a source electrode 258 as well as a drain electrode 256, which are laminated in this order from the lower side on the substrate 10.

Although the thin film transistor 500a has a so-called bottom gate structure, the present embodiment is not limited to this structure. If a person skilled in the art having ordinary technical knowledge refers to the disclosure of the present embodiment, the person can form a top gate structure by changing the orders of the steps. Temperatures indicated in this application relate to surface temperatures of a heating side of a heater in contact with the substrate 10. Patterning of an extraction electrode from each electrode is not illustrated in order for simplification of the drawings.

Similarly to the first embodiment, the substrate 10 can be made of any one of various insulating base materials including highly heat resistant glass, an $SiO_2$/Si substrate, an alumina ($Al_2O_3$) substrate, an STO (SrTiO) substrate, and a semiconductor substrate (e.g. an Si substrate, an SiC substrate, or a Ge substrate) such as an insulating substrate obtained by forming an STO (SrTiO) layer on a surface of an Si substrate with an $SiO_2$ layer and a Ti layer being interposed therebetween.

The thin film transistor 500a according to the present embodiment includes the gate electrode 224 made of oxide containing bismuth (Bi) and ruthenium (Ru). As described in the first embodiment, oxide as a different material in addition to the oxide as this material possibly contains inevitable impurities.

The thin film transistor 500a according to the present embodiment includes the gate insulating layer 234 made of oxide containing lanthanum (La) and zirconium (Zr).

The gate electrode 224 is about 100 nm in thickness and the gate insulating layer 234 is about 150 nm or more and about 170 nm or less in thickness in the present embodiment. The thickness of the gate electrode 224 or the gate insulating layer 234 according to the present embodiment is not limited to the above numerical value range.

The channel 244a according to the present embodiment is made of channel oxide (fourth oxide in the present embodiment) containing indium (In), zinc (Zn), and tin (Sn). The channel oxide contains zinc (Zn) having an atomic ratio of 0.15 or more and 0.75 or less relative to indium (In) assumed to be 1 in atomic ratio. The channel oxide contains tin (Sn) having an atomic ratio of 0.5 or more and 2 or less relative to indium (In) assumed to be 1 in atomic ratio.

The channel 244a is about 20 nm in thickness. Similarly to the thickness of the gate electrode 224 and the gate insulating layer 234 according to the present embodiment, the thickness of the channel 244a according to the present embodiment is not limited to 20 nm.

The source electrode 258 and the drain electrode 256 according to the present embodiment are each made of indium tin oxide (ITO).

2. Method for Manufacturing Thin Film Transistor 500a (1) Formation of Gate Electrode The gate electrode 224 according to the present embodiment is formed in accordance with a solution technique. As already described, in this application, the technique for forming the gate electrode 224, the gate insulating layer 234, or a different oxide layer by baking a precursor solution as a start material is also called a "solution technique" for the convenience purpose.

As shown in FIG. 23, initially formed on the substrate 10 in accordance with a known spin coating technique is a gate electrode precursor layer 222 from a gate electrode precursor solution as a start material including a precursor containing bismuth (Bi) and a precursor containing ruthenium (Ru) as solutes.

Examples of the precursor containing bismuth (Bi) for the gate electrode oxide according to the present embodiment include bismuth acetate. Examples of the precursor containing ruthenium (Ru) for the gate electrode oxide according to the present embodiment include ruthenium(III)nitrosylactate.

The precursor layer is then heated at a temperature of 80° C. or more and 300° C. or less for a predetermined time period (e.g. five minutes) so as to be preliminarily baked. This preliminary baking is performed in an oxygen atmosphere or in the atmosphere (hereinafter, also collectively referred to as an "atmosphere containing oxygen"). In the present embodiment, formation of a gate electrode precursor layer 222 according to a spin coating technique and preliminary baking described above are repeated five times or the like, so that the gate electrode 224 to be finally obtained has sufficient thickness (e.g. about 100 nm). The gate electrode precursor layer 222 is further heated at a temperature of 350° C. or more and 440° C. or less in an oxygen atmosphere (e.g. 100 percent by volume but not limited thereto; this applies to an "oxygen atmosphere" hereinafter) for a predetermined time period (e.g. 20 minutes) so as to be mainly baked. As shown in FIG. 24, formed on the substrate 10 is the gate insulating layer 224 made of oxide containing bismuth (Bi) and ruthenium (Ru).

(2) Formation of Gate Insulating Layer

As shown in FIG. 25, subsequently formed on the gate electrode 224 in accordance with a known spin coating technique is a gate insulating layer precursor layer 232 from a gate insulating layer precursor solution as a start material including a precursor containing lanthanum (La) and a precursor containing zirconium (Zr) as solutes.

Examples of the precursor containing lanthanum (La) for the gate insulating layer oxide according to the present embodiment include lanthanum methoxyethoxide. Examples of the precursor containing zirconium (Zr) for the gate insulating layer oxide according to the present embodiment include zirconium isopropoxide.

The precursor layer is then heated at a temperature of 80° C. or more and 300° C. or less for a predetermined time period (e.g. five minutes) so as to be preliminarily baked. This preliminary baking is performed in an atmosphere containing oxygen. In the present embodiment, formation of a gate insulating layer precursor layer 232 according to a spin coating technique and preliminary baking described above are repeated five times or the like, so that the gate insulating layer 234 to be finally obtained has sufficient thickness (e.g. about 150 nm or more and about 170 nm or less). The gate insulating layer precursor layer 232 is further heated at a temperature of 350° C. or more and 440° C. or less in an oxygen atmosphere for a predetermined time period (e.g. 20 minutes) so as to be mainly baked. As shown in FIG. 26, formed on the gate electrode 224 is the gate insulating layer 234 made of oxide containing lanthanum (La) and zirconium (Zr).

(3) Formation of Channel

As shown in FIG. 27, a channel precursor layer 242a is then formed on the gate insulating layer 234 in accordance with a known spin coating technique. In the present embodiment, the channel precursor layer 242a is formed from a channel precursor solution (a fourth precursor solution in the present embodiment) as a start material including a precursor containing indium (In), a precursor containing zinc (Zn), and a precursor containing tin (Sn) as solutes.

The channel precursor layer 242a is then heated at a temperature of 80° C. or more and 300° C. or less for a predetermined time period (e.g. five minutes) so as to be preliminarily baked. The channel precursor layer 242a is further heated at a temperature of 350° C. or more and 440° C. or less in an oxygen atmosphere for a predetermined time period (e.g. 20 minutes) so as to be mainly baked. As shown in FIG. 28, formed on the gate insulating layer 234 is the channel 244a made of oxide containing indium (In), zinc (Zn), and tin (Sn).

Examples of the precursor containing indium (In) for the channel 244a according to the present embodiment include indium methoxyethoxide. Examples of the precursor containing zinc (Zn) for the channel 244a according to the present embodiment include zinc methoxyethoxide. Examples of the precursor containing tin (Sn) for the channel 244a according to the present embodiment include tin tetraisopropoxide.

(4) Formation of Source Electrode and Drain Electrode

As shown in FIG. 29, further formed on the channel 244a is a resist film 90 patterned in accordance with a known photolithography technique. An ITO layer 250 is then formed on the channel 244a and the resist film 90 in accordance with a known sputtering technique. Examples of a target material according to the present embodiment include ITO that contains 5 wt % of tin oxide ($SnO_2$) and is formed at a room temperature. The resist film 90 is then removed. As shown in FIG. 30, formed on the channel 244a are the drain electrode 256 and the source electrode 258 each made of the ITO layer 250. Although the ITO layer 250 according to the present embodiment is about 130 nm in thickness, the thickness of the ITO layer 250 is not limited thereto.

As shown in FIG. 31, a resist film 90 patterned in accordance with a known photolithography technique is then formed on the drain electrode 256, the source electrode 258, and the channel 244a. Exposed portions of the channel 244a are thereafter removed in accordance with a known dry etching technique using argon (Ar) plasma while the resist film 90, part of the drain electrode 256, and part of the source electrode 258 serve as masks. As shown in FIG. 32, the patterned channel 244a is thus formed, so that the thin film transistor 500a is manufactured.

3. Properties of Thin Film Transistor 500a

Checked thereafter were electrical properties of the thin film transistor 500a manufactured in the fifth embodiment.

(1) Current-Voltage Properties

FIG. 33 is a graph indicating Vg-Id properties of the thin film transistor 500a. Reference sign $V_D$ in FIG. 33 denotes a voltage (V) that is applied between the source electrode 258 and the drain electrode 256 of the thin film transistor 500a, and the voltage $V_D$ is 2V in this case. Table 4 indicates a subthreshold characteristic (SS), electron field-effect mobility ($\mu_{FE}$), and an ON/OFF ratio of the thin film transistor 500a.

TABLE 4

| | Gate insulating layer oxide | | |
|---|---|---|---|
| Channel oxide | SS (mV/dec.) | $\mu_{FE}$ ($cm^2$/Vs) | $\dfrac{ON}{OFF}$ |
| LaZrO/ZnInSnO | 70~80 | 425.6 | >$10^6$ |

As indicated in FIG. 33 and Table 4, the Vg-Id properties of the thin film transistor 500a according to the fifth embodiment were checked to find that the subthreshold characteristic (SS) was 70 mV/dec. or more and 80 mV/dec or less. and the electron field-effect mobility ($\mu_{FE}$) was 425.6 $cm^2$Ns. The ON/OFF ratio was of the order of more than $10^6$. The thin film transistor 500a includes the gate electrode, the gate insulating layer, and the channel each of which is an oxide layer and formed in accordance with a solution technique. The thin film transistor 500a was found to sufficiently exert the functions as a transistor.

As described above, the thin film transistor 500a according to the present embodiment was found to possibly achieve the preferred electrical properties as a thin film transistor. In the method for manufacturing the thin film transistor 500a according to the present embodiment, the gate electrode, the gate insulating layer, and the channel are made of oxide and formed in accordance with a solution technique. This manufacturing method thus facilitates increase in area and significantly improves industrial and mass productivity performance as compared with a conventional method.

Modification Example of Fifth Embodiment

1. Entire Configuration of Thin Film Capacitor According to the Present Embodiment FIGS. 23 to 31 are sectional schematic views each showing a process in a method for manufacturing the thin film transistor 500 (500b in the present embodiment). FIG. 32 is a sectional schematic view showing a process in the method for manufacturing the thin film transistor 500b according to the present embodiment as well as the entire configuration thereof.

The present embodiment is similar to the fifth embodiment except that the thin film transistor 500b includes a channel 244b made of channel oxide containing indium (In) and zinc (Zn). Only different portions in the configuration of the thin film transistor 500b are thus to be described as compared with the configuration according to the fifth embodiment in FIG. 32.

As shown in FIG. 32, the thin film transistor 500b according to the present embodiment includes the gate electrode 224, the gate insulating layer 234, the channel 244 (the channel 244b in the present embodiment), and the source electrode 258 as well as the drain electrode 256, which are laminated in this order from the lower side on the substrate 10.

The channel 244b according to the present embodiment is made of channel oxide (fifth oxide in the present embodiment) containing indium (In) and zinc (Zn). The channel oxide contains zinc (Zn) having an atomic ratio of 0.25 or more and 1 or less relative to indium (In) assumed to be 1 in atomic ratio.

2. Method for Manufacturing Thin Film Transistor 500b

As shown in FIG. 27, a channel precursor layer 242b is formed on the gate insulating layer 234 in accordance with a known spin coating technique also in the method for manufacturing the thin film transistor 500b. In the present embodiment, the channel precursor layer 242b is formed from a channel precursor solution (a fifth precursor solution in the present embodiment) as a start material including a precursor containing indium (In) and a precursor containing zinc (Zn) as solutes.

The channel precursor layer 242b is then heated at a temperature of 80° C. or more and 300° C. or less for a predetermined time period so as to be preliminarily baked. The channel precursor layer 242b is further heated at a temperature of 350° C. or more and 440° C. or less in an oxygen atmosphere for a predetermined time period (e.g. five minutes) so as to be mainly baked. As shown in FIG. 28, formed on the gate insulating layer 234 is the channel 244b made of oxide containing indium (In) and zirconium (Zr). Examples of the precursor containing indium (In) according to the present embodiment include indium acetate. Examples of the precursor containing zinc (Zn) according to the present embodiment include zinc chloride.

3. Properties of Thin Film Transistor 500b

Checked thereafter were electrical properties of the thin film transistor 500b manufactured in the modification example of the fifth embodiment.

(1) Current-Voltage Properties

FIG. 34 is a graph indicating Vg-Id properties of the thin film transistor 500b. The voltage $V_D$ is 2V in FIG. 34. Table 5 indicates a subthreshold characteristic (SS), electron field-effect mobility (L), and an ON/OFF ratio of the thin film transistor 500b.

TABLE 5

| | Gate insulating layer oxide | | |
|---|---|---|---|
| Channel oxide | SS (mV/dec.) | $\mu_{FE}$ (cm$^2$/Vs) | ON/OFF |
| LaZrO/InZnO | 70~80 | 77.3 | >10$^6$ |

As indicated in FIG. 34 and Table 5, the Vg-Id properties of the thin film transistor 500b according to the modification example of the fifth embodiment were checked to find that the subthreshold characteristic (SS) was 70 mV/dec. or more and 80 mV/dec. or less and the electron field-effect mobility ($\mu_{FE}$) was 77.3 cm$^2$/Vs. The ON/OFF ratio was of the order of more than 10$^6$. The thin film transistor 500b includes the gate electrode, the gate insulating layer, and the channel each of which is an oxide layer and formed in accordance with a solution technique. The thin film transistor 500b was found to sufficiently exert the functions as a transistor.

As described above, the thin film transistor 500b according to the present embodiment was found to possibly achieve the preferred electrical properties as a thin film transistor. In the method for manufacturing the thin film transistor 500b according to the present embodiment, the gate insulating layer and the channel are made of oxide and formed in accordance with a solution technique. This manufacturing method thus facilitates increase in area and significantly improves industrial and mass productivity performance as compared with a conventional method.

Sixth Embodiment

The present embodiment is similar to the fifth embodiment except that imprinting is performed during formation of part of the layers in the fifth embodiment. Accordingly, the disclosure duplicating with that of the fifth embodiment may not be provided repeatedly.

1. Method for Manufacturing Thin Film Transistor 600a

FIGS. 35 to 39 are sectional schematic views each showing a process in a method for manufacturing a thin film transistor 600 (600a in the present embodiment). FIG. 40 is a sectional schematic view showing a process in the method for manufacturing the thin film transistor 600a according to the present embodiment as well as the entire configuration thereof. Patterning of an extraction electrode from each electrode is not illustrated in order for simplification of the drawings.

(1) Formation of Gate Electrode

Similarly to the fifth embodiment, initially formed on the substrate 10 is the gate electrode precursor layer 222 from a gate electrode precursor solution as a start material including a precursor containing bismuth (Bi) and a precursor containing ruthenium (Ru) as solutes. The precursor layer is then preliminarily baked in a state where the precursor layer is heated to a temperature of 80° C. or more and 250° C. or less in an atmosphere containing oxygen.

The gate electrode precursor layer 222 simply preliminarily baked is imprinted in the present embodiment. Specifically, as shown in FIG. 35, imprinting is performed using a gate electrode mold M3 with a pressure of 1 MPa or more and 20 MPa or less in a state where the precursor layer is heated to a temperature of 80° C. or more and 300° C. or less so as to pattern the gate electrode layer.

The gate electrode precursor layer 222 is then entirely etched, so that the gate electrode precursor layer 222 is removed in the regions other than a region corresponding to a gate insulating layer (the step of entirely etching the gate electrode precursor layer 222). The step of etching the gate electrode precursor layer 222 in the present embodiment was executed in accordance with a wet etching technique without including a vacuum process. The etching can be possibly performed in accordance with a so-called dry etching technique using plasma.

The precursor layer is then heated at a temperature of 350° C. or more and 440° C. or less for a predetermined time period (e.g. 20 minutes) so as to be mainly baked. As shown in FIG. 36, the gate electrode 224 is formed on the substrate 10.

(2) Formation of Gate Insulating Layer

Similarly to the fifth embodiment, subsequently formed on the substrate 10 and the gate electrode 224 is the gate insulating layer precursor layer 232 from a precursor solution as a start material including a precursor containing lanthanum (La) and a precursor containing zirconium (Zr) as solutes. The precursor layer is then preliminarily baked in a state where the precursor layer is heated to a temperature of 80° C. or more and 250° C. or less in an atmosphere containing oxygen. Although the gate insulating layer precursor layer 232 is not imprinted in the present embodiment, the present embodiment is not limited to this aspect. For example, similarly to the fourth embodiment, this gate insulating layer precursor layer 232 can also be imprinted and then entirely etched to form an imprinted structure.

Specifically, in the imprinting step during formation of the gate insulating layer 234, the gate insulating layer precursor layer 232 is imprinted in a state where the gate insulating layer precursor layer 232 is heated at a temperature of 80° C. or more and 300° C. or less in an atmosphere containing oxygen before the gate insulating layer 232 is formed. This imprinting allows the gate insulating layer precursor layer 232 to have an imprinted structure.

In the present embodiment, the precursor layer is preliminarily baked similarly to the fifth embodiment and is then heated at a temperature of 350° C. or more and 440° C. or less for a predetermined time period (e.g. 20 minutes) so as to be mainly baked. The gate insulating layer 234 is thus formed on the substrate 10 and the gate electrode 224.

(3) Formation of Channel

Similarly to the fifth embodiment, the channel precursor layer 242a is then formed on the substrate 10 and the gate insulating layer 234, from a channel precursor solution (the fourth precursor solution in the present embodiment) as a start material including a precursor containing indium (In), a precursor containing zinc (Zn), and a precursor containing tin (Sn) as solutes. The precursor layer is then preliminarily baked in a state where the precursor layer is heated to a temperature of 80° C. or more and 300° C. or less in an atmosphere containing oxygen. Although the channel 244 (the channel 244a in the present embodiment) is not imprinted in the present embodiment, the present embodiment is not limited to this aspect. For example, similarly to the fourth embodiment, this channel 244a can also be imprinted and then entirely etched to form an imprinted structure.

Specifically, in the imprinting step during formation of the channel 244a, the channel precursor layer 242a is imprinted in a state where the channel precursor layer 242a is heated at a temperature of 80° C. or more and 300° C. or less in an atmosphere containing oxygen before the channel 244a is formed. This imprinting allows the channel precursor layer 242a to have an imprinted structure.

In the present embodiment, the precursor layer is preliminarily baked similarly to the fifth embodiment and is then heated at a temperature of 350° C. or more and 440° C. or less for a predetermined time period (e.g. 20 minutes) so as to be mainly baked. The channel 244a is thus formed on the substrate 10 and the gate insulating layer 234.

(4) Formation of Source Electrode and Drain Electrode

The present embodiment further includes processing according to a solution technique and imprinting. Similarly to formation of the gate electrode, the source electrode and the drain electrode are formed from a source/drain electrode precursor solution as a start material including a precursor containing bismuth (Bi) and a precursor containing ruthenium (Ru) as solutes. Details thereof are described below.

Formed on the channel 244a thus obtained is a source/drain electrode precursor layer 252 from the source/drain electrode precursor solution as a start material including the precursor containing bismuth (Bi) and the precursor containing ruthenium (Ru) as solutes. The precursor layer is then preliminarily baked in a state where the precursor layer is heated to a temperature of 80° C. or more and 250° C. or less in an atmosphere containing oxygen.

As shown in FIG. 38, imprinting is performed using a source/drain electrode mold M4 with a pressure of 1 MPa or more and 20 MPa or less in a state where the precursor layer is heated to a temperature of 80° C. or more and 300° C. or less so as to pattern the source/drain electrode. The source/drain electrode precursor layer 252 of about 100 nm to about 300 nm in thickness is thus formed in regions where the source electrode and the drain electrode are to be provided ((a) in FIG. 39). The source/drain electrode precursor layer 252 of about 10 nm to about 100 nm in thickness is formed in a region where the channel oxide layer 244 is to remain ((b) in FIG. 39). The source/drain electrode precursor layer 252 of about 10 nm to about 100 nm in thickness is formed in regions where the channel oxide layer 244 is to be removed ((c) in FIG. 39). At least part of the effects of the fifth embodiment can be exerted when imprinting is performed using the source/drain electrode mold M4 with a pressure of 1 MPa or more and 20 MPa or less.

The source/drain electrode precursor layer 252 is then heated at a temperature of 240° C. or more and 440° C. or less in the atmosphere for a predetermined time period (e.g. 20 minutes) so as to be mainly baked. A source/drain electrode oxide layer 254 is thus formed.

The source/drain electrode oxide layer 254 is then entirely dry etched by argon (Ar) plasma. The source/drain electrode oxide layer 254 in the thinnest regions ((c) in FIG. 39) is etched initially, and exposed portions of the channel oxide layer 244 are etched subsequently. The source/drain electrode oxide layer 254 in the second thinnest region ((b) in FIG. 39) is then etched. When the channel 244a in the thinnest regions ((c) in FIG. 39) is etched, the plasma processing is stopped. In this manner, the thickness of the layer in each of the regions (b) and (c) is adjusted in the present embodiment. The channel 244a in the regions (c) is thus removed whereas the channel 244a in the region (b) remains. As shown in FIG. 40, the channel region itself can be separated and the source electrode 258 and the drain electrode 256 are formed so as to be completely separated from each other with the channel region being interposed therebetween.

The source electrode 258 and the drain electrode 256 according to the present embodiment each had resistivity of the order of $10^{-3}$ Ωcm or less.

The etching step according to the present embodiment is executed in accordance with a dry etching technique using argon (Ar) plasma. The etching step can be alternatively executed in accordance with a wet etching technique without including a vacuum process.

As described above, the present embodiment includes the "imprinting step" of imprinting each of the oxide layers to form an imprinted structure. By including the imprinting step, the present embodiment does not need to include a process requiring relatively a long time period and/or expensive equipment, such as a vacuum process, a process in accordance with a photolithography technique, or an ultraviolet irradiation process. The source electrode and the drain electrode are formed also in accordance with a solution technique in the present embodiment. The present embodiment is thus significant in that all the oxide layers including the gate electrode, the gate insulating film, the channel, the source electrode, and the drain electrode configuring the device are formed in accordance with a solution technique. The thin film transistor 600 according to the present embodiment is thus quite excellent in industrial and mass productivity performance.

Modification Example of Sixth Embodiment

The present embodiment is similar to the sixth embodiment except that a thin film transistor 600b includes the channel 244b made of channel oxide containing indium (In) and zinc (Zn). Accordingly, the disclosure duplicating with that of the sixth embodiment may not be provided repeatedly.

FIGS. 35 to 39 are sectional schematic views each showing a process in a method for manufacturing the thin film transistor 600 (600b in the present embodiment). FIG. 40 is a sectional schematic view showing a process in the method for manufacturing the thin film transistor 600b according to the present embodiment as well as the entire configuration thereof.

1. Method for Manufacturing Thin Film Transistor 600b

The channel precursor layer 242b is formed on the gate insulating layer 234 in accordance with a known spin coating technique also in the method for manufacturing the thin film transistor 600b. In the present embodiment, the channel precursor layer 242b is formed from a channel precursor solution (a fifth precursor solution in the present embodiment) as a start material including a precursor containing indium (In) and a precursor containing zinc (Zn) as solutes.

The precursor layer is then preliminarily baked in a state where the precursor layer is heated to a temperature of 80° C. or more and 250° C. or less in an atmosphere containing oxygen. Although the channel 244 (the channel 244b in the present embodiment) is not imprinted in the present embodiment, the present embodiment is not limited to this aspect. For example, similarly to the fourth embodiment, this channel 244b can also be imprinted and then entirely etched to form an imprinted structure.

In the present embodiment, the precursor layer is preliminarily baked similarly to the sixth embodiment and is then heated at a temperature of 350° C. or more and 440° C. or less for a predetermined time period (e.g. 20 minutes) so as to be mainly baked. The channel 244b is thus formed on the substrate 10 and the gate insulating layer 234.

The source electrode and the drain electrode are then formed in accordance with a solution technique and through imprinting similarly to the sixth embodiment.

As described above, the present embodiment includes the "imprinting step" of imprinting each of the oxide layers to form an imprinted structure. By including the imprinting step, the present embodiment does not need to include a process requiring relatively a long time period and/or expensive equipment, such as a vacuum process, a process in accordance with a photolithography technique, or an ultraviolet irradiation process. The source electrode and the drain electrode are formed also in accordance with a solution technique in the present embodiment. The present embodiment is thus significant in that all the oxide layers including the gate electrode, the gate insulating film, the channel, the source electrode, and the drain electrode configuring the device are formed in accordance with a solution technique. The thin film transistor 600 according to the present embodiment is thus quite excellent in industrial and mass productivity performance.

The fifth embodiment, the modification example of the fifth embodiment, the sixth embodiment, and the modification example of the sixth embodiment are significant in that each of the layers is heated at a maximum temperature not exceeding 440° C. The thin film transistor according to each of the embodiments can significantly achieve energy saving and cost reduction. In view of the above, the thin film transistor according to each of the embodiments is thus quite excellent in industrial and mass productivity performance.

Other Embodiments

In order to appropriately exert the effects of each of the embodiments described above, the gate electrode layer precursor solution preferably includes a solvent mixture of two alcohols selected from the group consisting of ethanol, propanol, butanol, 2-methoxyethanol, 2-ethoxyethanol, and 2-butoxyethanol. The second precursor solution preferably includes a solvent of one alcohol selected from the group consisting of ethanol, propanol, butanol, 2-methoxyethanol, 2-ethoxyethanol, and 2-butoxyethanol, or a solvent of one carboxylic acid selected from the group consisting of acetic acid, propionic acid, and octylic acid. The channel precursor solution preferably includes a solvent of one alcohol selected from the group consisting of ethanol, propanol, butanol, 2-methoxyethanol, 2-ethoxyethanol, and 2-butoxyethanol, or a solvent of one carboxylic acid selected from the group consisting of acetic acid, propionic acid, and octylic acid.

Furthermore, in order to appropriately exert the effects of each of the embodiments described above, the gate electrode precursor solution preferably includes a solvent of one alcohol selected from the group consisting of ethanol, propanol, butanol, 2-methoxyethanol, 2-ethoxyethanol, and 2-butoxyethanol, or a solvent of one carboxylic acid selected from the group consisting of acetic acid, propionic acid, and octylic acid. The source/drain electrode precursor solution preferably includes a solvent of one alcohol selected from the group consisting of ethanol, propanol, butanol, 2-methoxyethanol, 2-ethoxyethanol, and 2-butoxyethanol, or a solvent of one carboxylic acid selected from the group consisting of acetic acid, propionic acid, and octylic acid.

Preliminary baking for formation of each of the oxide layers in each of the embodiments described above is performed most preferably at a preliminary baking temperature of 100° C. or more and 250° C. or less. The solvent in each of the precursor layers can be evaporated more reliably at such a preliminary baking temperature. Particularly in a case where imprinting is performed afterward, preliminary baking within this temperature range can cause a preferred gel state for exertion of properties that enable future plastic deformation (possibly a state where organic chains remain before thermal decomposition).

In the sixth embodiment, the gate electrode is formed from the gate electrode precursor solution as a start material including the precursor containing bismuth (Bi) and the precursor containing ruthenium (Ru) as solutes. The sixth embodiment is, however, not limited to this gate electrode precursor solution. According to a different possible aspect, the gate electrode is formed from a gate electrode precursor solution as a start material including a precursor containing lanthanum (La), a precursor containing bismuth (Bi), and a precursor containing ruthenium (Ru) as solutes. Formed in this case is gate electrode oxide (possibly including inevitable impurities) containing lanthanum (La), bismuth (Bi), and ruthenium (Ru).

The precursor layer having high plastic deformability is imprinted in each of the fourth and sixth embodiments. Even in a case where a low pressure in the range of 1 MPa or more and 20 MPa or less is applied for imprinting, each of the precursor layers is deformed so as to follow the shape of the surface of the corresponding mold, so that a desired imprinted structure can be formed highly accurately. When the pressure is set to the low range of 1 MPa or more and 20 MPa or less, the mold is less likely to be damaged by imprinting and increase in area can be advantageously achieved.

The above pressure was set to the range of "1 MPa or more and 20 MPa or less" for the following reasons. Firstly, if the pressure is less than 1 MPa, each of the precursor layers may not be imprinted because the pressure is too low. In contrast, the precursor layer can be sufficiently imprinted with the pressure as high as 20 MPa, and there is no need to increase the pressure. In view of the above, in the imprinting step according to each of the fourth to sixth embodiments and the modification example of the sixth embodiment, imprinting is performed more preferably with a pressure in the range of 2 MPa or more and 10 MPa or less.

The source electrode and the drain electrode obtained from the source/drain electrode precursor solution as a start material according to the sixth embodiment or the modification example of the sixth embodiment can be replaced with a source electrode and a drain electrode obtained from a source/drain electrode precursor solution as a start material including a precursor containing lanthanum (La), a precursor containing bismuth (Bi) and a precursor containing ruthenium (Ru) as solutes. The source electrode and the drain electrode can be formed at a substantially same baking temperature also in this case. Similarly to the imprinting of the source/drain electrode precursor layer 252 in the sixth embodiment, applicable is imprinting of a source/drain electrode precursor layer including a precursor containing lanthanum (La), a precursor containing bismuth (Bi), and a precursor containing ruthenium (Ru) as solutes.

After the channel 244a or 244b is formed in the sixth embodiment or the modification example of the sixth embodiment, the source electrode and the drain electrode, each of which is made of an ITO layer, can be formed through processing according to a solution technique and imprinting. Details thereof are described below.

The channel 244a or 244b is formed initially. Similarly to the fifth embodiment or the modification example of the fifth embodiment, formed on the channel 244a or 244b in accordance with a known spin coating technique is the source/drain electrode precursor layer 252 from a source/drain electrode precursor solution as a start material including a precursor containing indium (In) and a precursor containing tin (Sn) as solutes. Examples of the precursor containing indium (In) for the source/drain electrode oxide layer 254 according to this aspect can include indium acetate, indium nitrate, indium chloride, and any indium alkoxide (e.g. indium isopropoxide, indium butoxide, indium ethoxide, or indium methoxyethoxide). Examples of the precursor containing tin (Sn) for the source/drain electrode oxide layer 254 according to the present embodiment can include tin acetate, tin nitrate, tin chloride, and any tin alkoxide (e.g. tin isopropoxide, tin butoxide, tin ethoxide, or tin methoxyethoxide).

In this case, the source/drain electrode precursor layer is heated to 150° C. in the atmosphere for about five minutes or the like so as to be preliminarily baked, and imprinting is then performed using the source/drain electrode mold M4 with the pressure of 5 MPa in a state where the source/drain electrode precursor layer is heated to 200° C. or the like so as to pattern the source/drain electrode. The source/drain electrode precursor layer is then heated to a temperature of 250° C. or more and 400° C. or less in the atmosphere for about five minutes or the like so as to be mainly baked. The source/drain electrode oxide layer is thus formed. When the precursor layer is further heated to 450° C. for about 15 minutes or the like in a nitrogen atmosphere so as to be mainly baked, oxygen deficiency occurs in ITO. This deficiency causes an oxygen deficiency carrier for conductivity and thus improves conductivity.

In the imprinting step in each of the embodiments, preferably, mold separation processing is preliminarily performed on the surface of each of the precursor layers to be in contact with an imprinting surface and/or on the imprinting surface of the mold, and each of the precursor layers is then imprinted. Such processing achieves decrease in frictional force between each of the precursor layers and the mold, so that each of the precursor layers can be imprinted more accurately. Examples of a mold separation agent applicable to mold separation include surface active agents (e.g. a fluorochemical surface active agent, a silicon surface active agent, and a non-ionic surface active agent), and diamond-like carbon containing fluorine.

According to a more preferred aspect, included between the imprinting step and the main baking step for each of the precursor layers in each of the embodiments described above, is the step of entirely etching the precursor layer (e.g. the source/drain electrode precursor layer) under the condition where the precursor layer is removed in the thinnest region of the imprinted precursor layer. This is because the unnecessary region can be removed more easily than the case of etching each of the precursor layers already mainly baked. The entire etching step after main baking in each of the embodiments described above can be thus replaced with the etching step according to the more preferred aspect.

As described above, the above embodiments have been disclosed not for limiting the present invention but for describing these embodiments. Furthermore, modification examples made within the scope of the present invention, inclusive of different combination of the embodiments, will also be included in the scope of the patent claims.

The invention claimed is:

1. A method for manufacturing a thin film transistor, comprising:
    a gate insulating layer forming step of forming a gate insulating layer made of oxide comprising: lanthanum (La) and zirconium (Zr) by heating, in an atmosphere containing oxygen, a gate insulating layer precursor layer obtained from a gate insulating layer precursor solution as a start material including a precursor containing lanthanum (La) and a precursor containing zirconium (Zr) as solutes, the gate insulating layer being in contact with a gate electrode layer,
    the gate insulating layer forming step being performed between a step of forming the gate electrode layer and a step of forming a channel by forming channel oxide,
    the step of forming the channel including
    heating, in an atmosphere containing oxygen, a channel precursor layer obtained from, as a start material, one of:
    (1) a first precursor solution including, as solutes, a precursor containing indium (In), a precursor containing zinc (Zn), and a precursor containing zirconium (Zr) having an atomic ratio of 0.015 or more and 0.075 or less relative to the indium (In) assumed to be 1 in atomic ratio, or (2) a second precursor solution including, as solutes, a precursor containing indium (In) and a precursor containing zirconium (Zr) having an atomic ratio of 0.055 or more and 0.16 or less relative to the indium (In) assumed to be 1 in atomic ratio, or
(3) a third precursor solution including, as solutes, a precursor containing indium (In) and a precursor containing lanthanum (La) having an atomic ratio of 0.055 or more and 0.16 or less relative to the indium (In) assumed to be 1 in atomic ratio, to form the channel oxide including one of:
(1) a first oxide comprising indium (In), zinc (Zn), and zirconium (Zr) having an atomic ratio of 0.015 or more and 0.075 or less relative to the indium (In) assumed to be 1 in atomic ratio, or
(2) a second oxide comprising indium (In) and zirconium (Zr) having an atomic ratio of 0.055 or more and 0.16 or less relative to the indium (In) assumed to be 1 in atomic ratio, or
(3) a third oxide comprising indium (In) and lanthanum (La) having an atomic ratio of 0.055 or more and 0.16 or less relative to the indium (In) assumed to be 1 in atomic ratio.

2. The method for manufacturing the thin film transistor according to claim 1, wherein
the gate insulating layer is formed by heating at a heating temperature of 350° C. or more and 550° C. or less, and
the channel is formed by heating at a heating temperature of 350° C. or more and 550° C. or less.

3. The method for manufacturing the thin film transistor according to claim 1, wherein
the channel oxide includes the first oxide and has an amorphous phase.

* * * * *